(12) United States Patent
Hori et al.

(10) Patent No.: US 11,658,231 B2
(45) Date of Patent: May 23, 2023

(54) SEMICONDUCTOR DEVICE

(71) Applicant: FUJI ELECTRIC CO., LTD., Kawasaki (JP)

(72) Inventors: Motohito Hori, Matsumoto (JP);
Yoshinari Ikeda, Matsumoto (JP);
Akira Hirao, Matsumoto (JP);
Tsunehiro Nakajima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 205 days.

(21) Appl. No.: 17/085,274

(22) Filed: Oct. 30, 2020

(65) Prior Publication Data
US 2021/0184023 A1 Jun. 17, 2021

(30) Foreign Application Priority Data

Dec. 17, 2019 (JP) .............................. JP2019-227707

(51) Int. Cl.
*H01L 29/739* (2006.01)
*H01L 29/06* (2006.01)
*H01L 27/06* (2006.01)

(52) U.S. Cl.
CPC ...... *H01L 29/7393* (2013.01); *H01L 27/0623* (2013.01); *H01L 29/0696* (2013.01)

(58) Field of Classification Search
CPC .............. H01L 23/4951; H01L 25/072; H01L 29/7393
See application file for complete search history.

(56) References Cited

U.S. PATENT DOCUMENTS

| | | | |
|---|---|---|---|
| 5,006,921 | A | 4/1991 | Ishizuka et al. |
| 5,459,655 | A | 10/1995 | Mori et al. |
| 2003/0141587 | A1 | 7/2003 | Frey |
| 2004/0195649 | A1 | 10/2004 | Miura et al. |
| 2008/0251909 | A1 | 10/2008 | Tokuyama et al. |
| 2009/0243089 | A1 | 10/2009 | Hohlfeld et al. |
| 2011/0037166 | A1 | 2/2011 | Ikeda et al. |

(Continued)

FOREIGN PATENT DOCUMENTS

| | | |
|---|---|---|
| JP | H0294448 A | 4/1990 |
| JP | H05206449 A | 8/1993 |

(Continued)

*Primary Examiner* — Matthew C Landau
*Assistant Examiner* — Mark Hatzilambrou
(74) *Attorney, Agent, or Firm* — Rabin & Berdo, P.C.

(57) ABSTRACT

A semiconductor device having a semiconductor module. The semiconductor module includes first and second conductor layers facing each other, a first semiconductor element provided between the first and second conductor layers, positive and negative electrode terminals respectively provided on edge portions of the first and second conductor layers at a first side of the semiconductor module in a top view of the semiconductor module, control wiring that is electrically connected to the first control electrode, and that extends out of the first and second conductor layers at a second side of the semiconductor module that is opposite to the first side in the top view, and a control terminal that is electrically connected to the control wiring, that is positioned outside the first and second conductor layers in the top view, and that has an end portion that is aligned with the positive and negative electrode terminals.

10 Claims, 21 Drawing Sheets

(56) References Cited

U.S. PATENT DOCUMENTS

| | | |
|---|---|---|
| 2012/0087095 A1 | 4/2012 | Tokuyama et al. |
| 2014/0138707 A1 | 5/2014 | Miki et al. |
| 2015/0223339 A1 | 8/2015 | Nakamura et al. |
| 2016/0343641 A1 | 11/2016 | Hori et al. |
| 2017/0309544 A1 | 10/2017 | Kobayashi et al. |
| 2019/0074236 A1 | 3/2019 | Fuku et al. |
| 2019/0214332 A1* | 7/2019 | Chen ................ H01L 23/49517 |

FOREIGN PATENT DOCUMENTS

| | | | |
|---|---|---|---|
| JP | 2004296588 A | 10/2004 | |
| JP | 2006502560 A | 1/2006 | |
| JP | 2007012685 A | 1/2007 | |
| JP | 2008103623 A | 5/2008 | |
| JP | 2008259267 A | 10/2008 | |
| JP | 2010258315 A | 11/2010 | |
| JP | 2012119651 A | 6/2012 | |
| JP | 2016046279 A | 4/2016 | |
| JP | 2016066660 A | 4/2016 | |
| JP | 2016167635 A | 9/2016 | |
| JP | 2019050300 A | 3/2019 | |
| WO | 2009125779 A1 | 10/2009 | |
| WO | 2014061211 A1 | 4/2014 | |
| WO | 2015029511 A1 | 3/2015 | |
| WO | 2016031462 A1 | 3/2016 | |
| WO | 2016121159 A1 | 8/2016 | |
| WO | 2017203650 A1 | 11/2017 | |

* cited by examiner

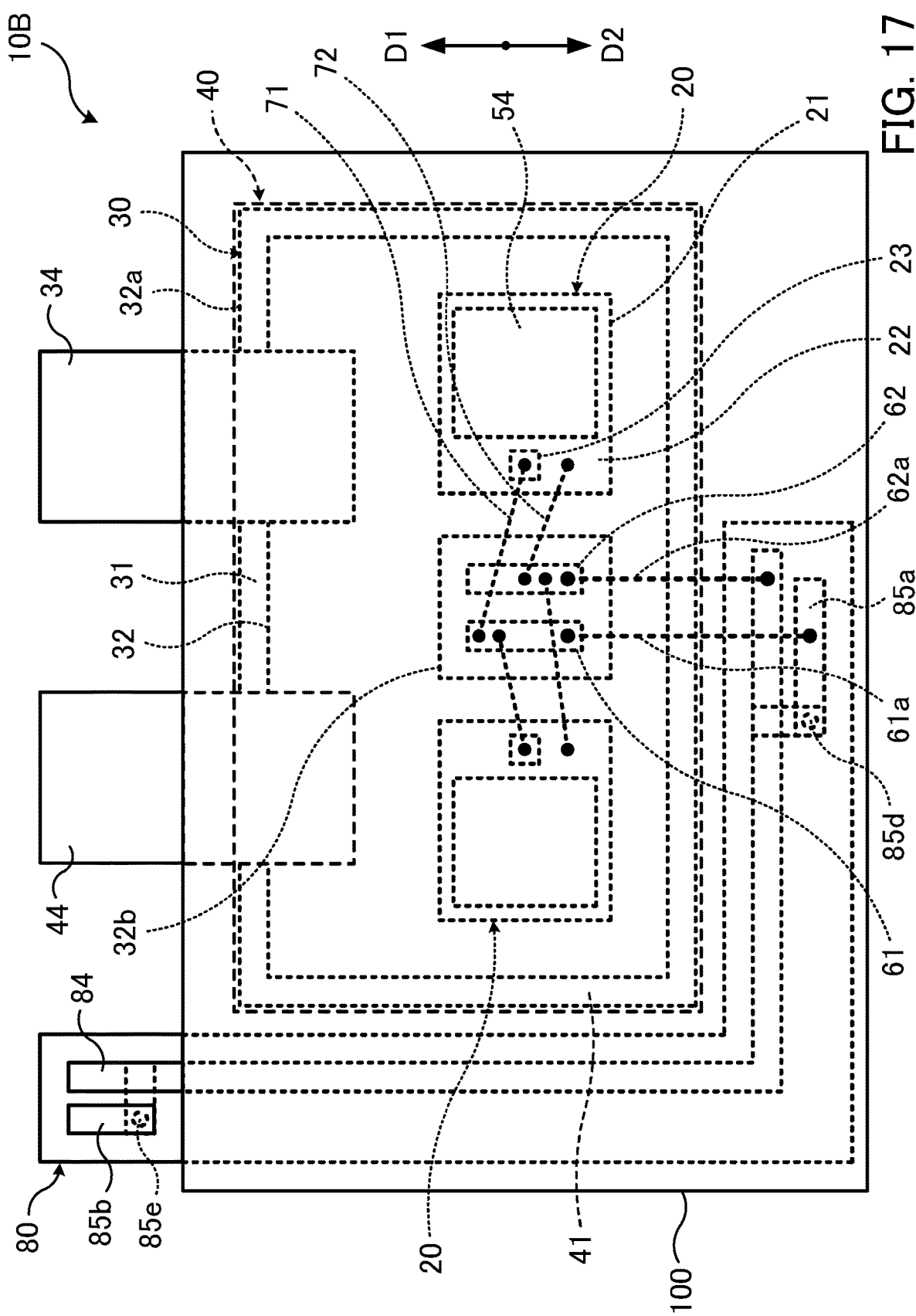

SEMICONDUCTOR DEVICE

CROSS-REFERENCE TO RELATED APPLICATION

This application is based upon and claims the benefit of priority of the prior Japanese Patent Application No. 2019-227707, filed on Dec. 17, 2019, the entire contents of which are incorporated herein by reference.

BACKGROUND OF THE INVENTION

1. Field of the Invention

The embodiments discussed herein relate to a semiconductor device.

2. Background of the Related Art

Semiconductor devices that use semiconductor elements, such as IGBT (Insulated Gate Bipolar Transistors) and power MOSFETs (Metal Oxide Semiconductor Field Effect Transistors), are used as independent devices or as integral parts of equipment such as inverters, uninterruptible power supplies, machine tools, and industrial robots.

A known technology for configuring a semiconductor device uses semiconductor elements that have a positive main electrode on one main surface and a negative main electrode and a control electrode on the other main surface. In one known configuration, these semiconductor elements are provided between two facing substrates that have metal, in the form of foil or a plate, provided on the main surface of an insulating board, and the positive and negative main electrodes are electrically connected via the metal on the facing substrates and/or solder. When configuring a device in this way, external connection terminals that serve as the positive electrode and the negative electrode are electrically connected to the metal on the substrates that is electrically connected to the main positive and negative electrodes of the semiconductor elements. A control terminal is also electrically connected to the control electrodes of the semiconductor elements via metal wires.

See, for example, International Publication Pamphlet No. WO2009/125779.

In a semiconductor device like that described above, a control voltage for controlling operations (switching) is applied from the control terminal to the control electrodes of the semiconductor elements. When an on voltage is applied to turn a semiconductor element on, the main current flows into the semiconductor element via the external connection terminal on the positive electrode side, the metal on the substrate that is electrically connected to the external connection terminal, and one of the main electrodes. The main current then flows out of the semiconductor element via the other main electrode on the negative electrode side, the metal on the substrate that is electrically connected to the main electrode, and an external connection terminal. When an off voltage that turns the semiconductor element off is applied, the main current is stopped.

When a semiconductor device of this type uses a layout where the electromagnetic field caused by the main current flowing between the external connection terminals connected to the pair of main electrodes of a semiconductor element may have a comparatively large effect on the current flowing on a control signal path from the control terminal to the control electrode of that semiconductor element, the resulting effect on the control voltage may cause a drop in operation performance of the semiconductor element. On the other hand, using a layout that places the control signal path as far as possible from the current path of the main current to suppress the influence of the electromagnetic field caused by the main current may increase the size of the semiconductor device.

SUMMARY OF THE INVENTION

According to an aspect, there is provided a semiconductor device, including: a semiconductor module that includes: a first conductor layer; a second conductor layer that faces the first conductor layer; a first semiconductor element that is provided between the first conductor layer and the second conductor layer, and that has a first control electrode, a first positive electrode electrically connected to the first conductor layer, and a first negative electrode electrically connected to the second conductor layer; a positive electrode terminal provided on an edge portion of the first conductor layer at a first side of the semiconductor module in a top view of the semiconductor module; a negative electrode terminal provided on an edge portion of the second conductor layer at the first side of the semiconductor module in the top view thereof; control wiring that is electrically connected to the first control electrode, and that extends out of the first conductor layer and the second conductor layer at a second side of the semiconductor module that is opposite to the first side in the top view; and a control terminal that is electrically connected to the control wiring, that is positioned outside the first conductor layer and the second conductor layer in the top view, and that has an end portion that is aligned with the positive electrode terminal and the negative electrode terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 17 depicts one example of a semiconductor device according to a fifth embodiment;

DETAILED DESCRIPTION OF THE INVENTION

First Embodiment

Figure 1:
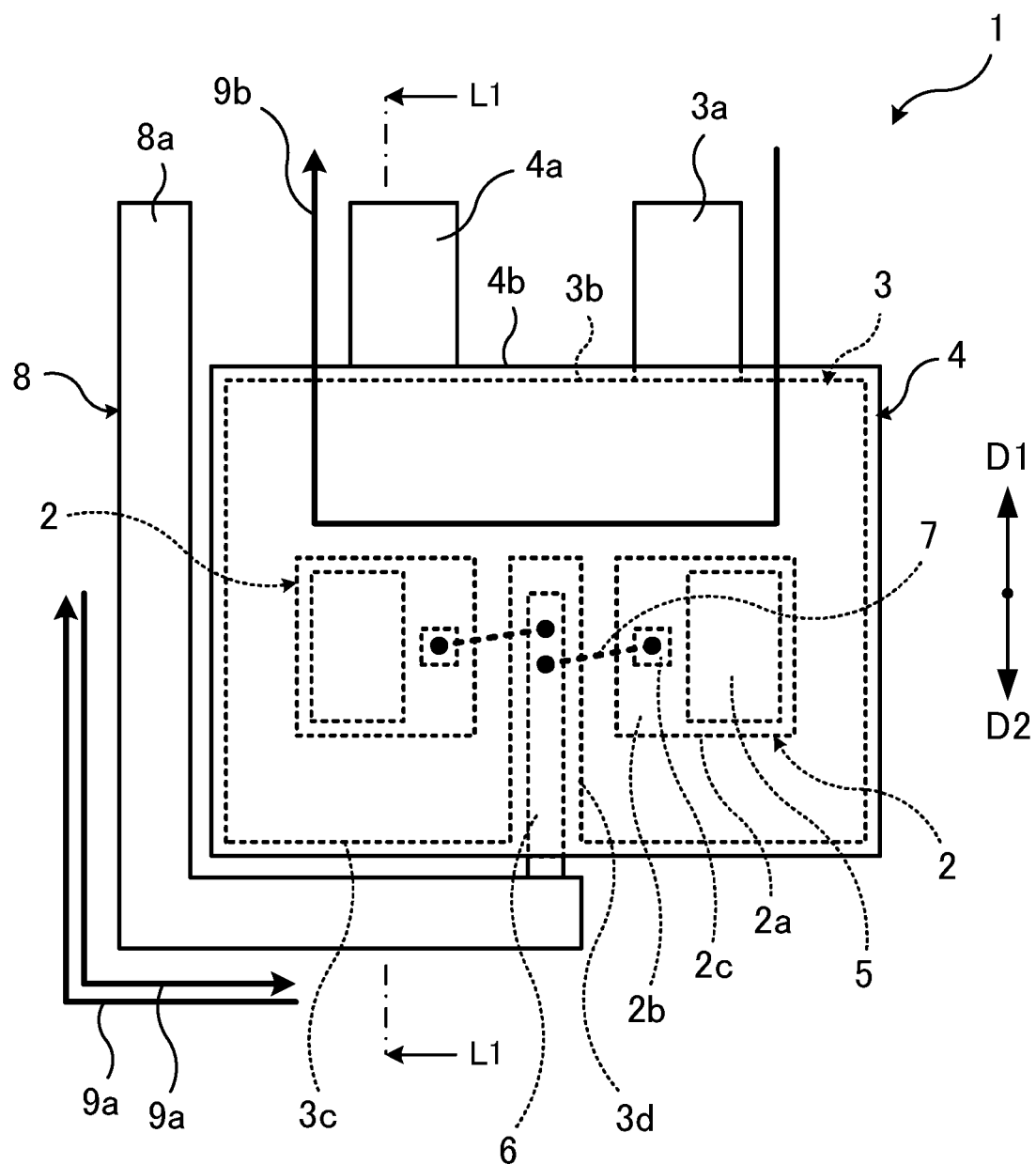
FIG. 1 depicts one example of a semiconductor device according to a first embodiment.
Figure 2:
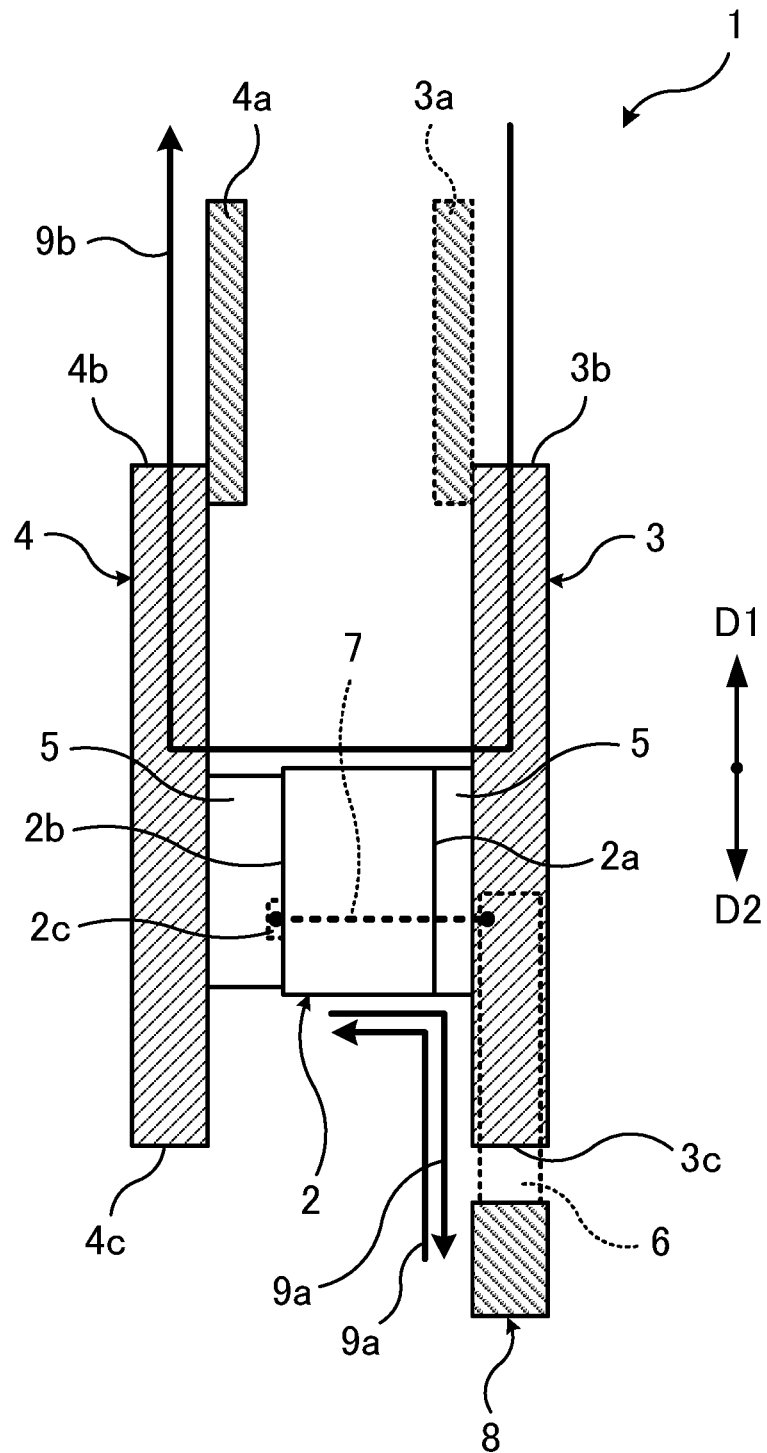
FIG. 2 depicts the same example of a semiconductor device according to the first embodiment.
Figure 3A:
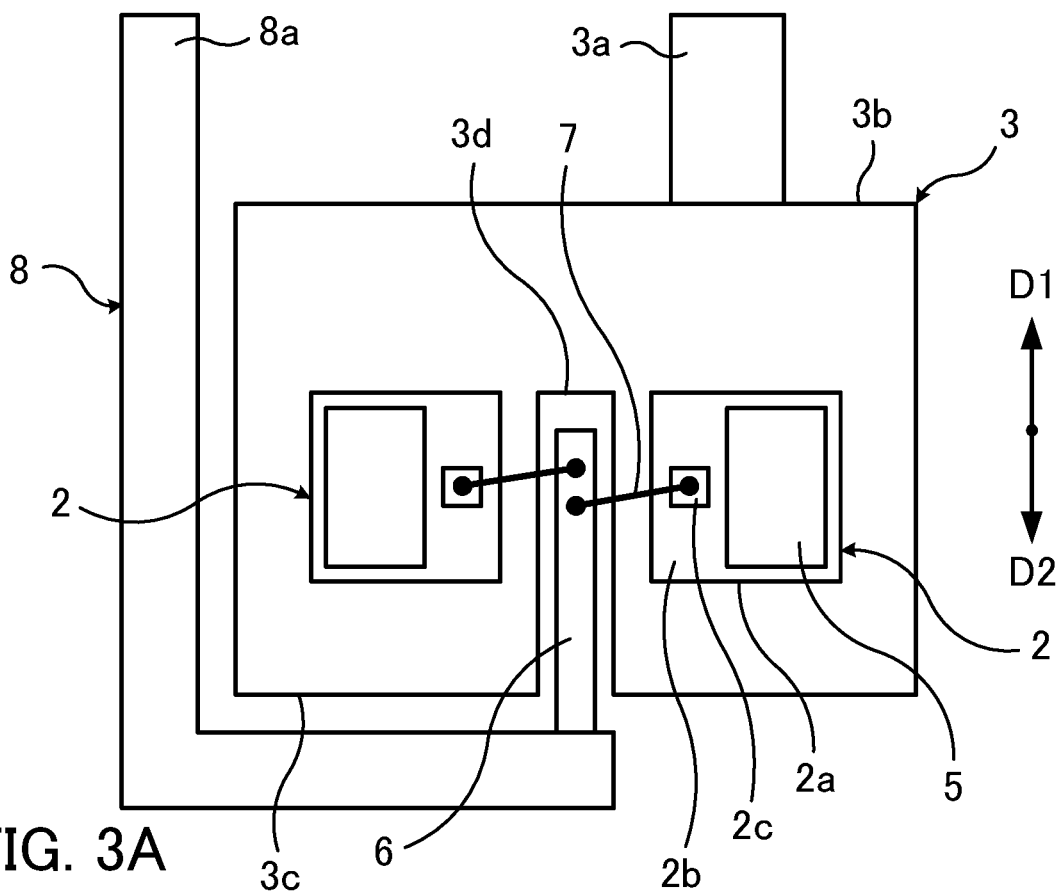
FIGS. 3A and 3B depict the same example of a semiconductor device according to the first embodiment.
Figure 3B:
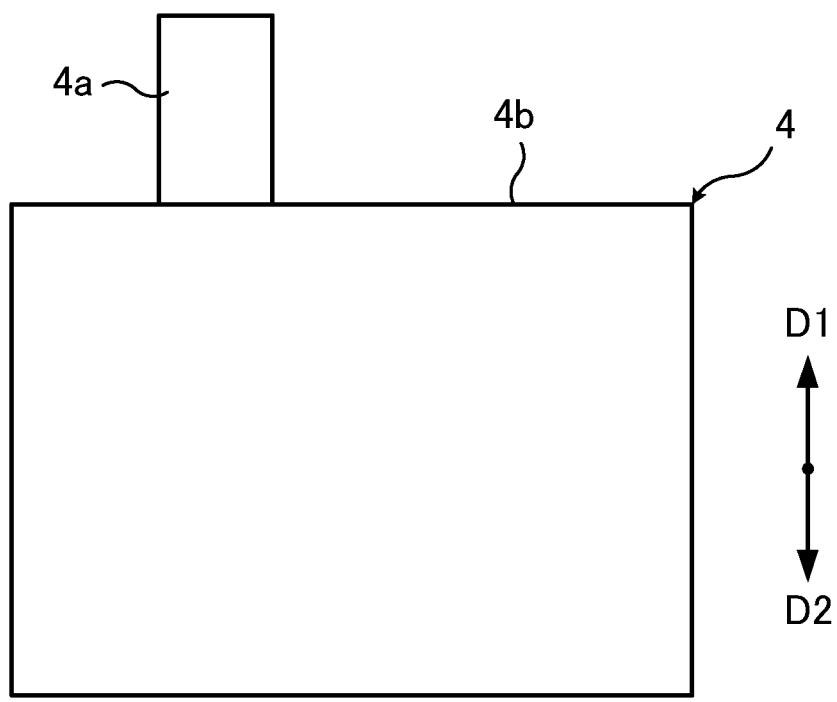

FIG. 1 to FIG. 3 depict one example of a semiconductor device according to a first embodiment. FIG. 1 is a schematic plan view depicting a principal part of one example of a semiconductor device. FIG. 2 is a schematic cross-sectional view taken along a line L1-L1 in FIG. 1. FIGS. 3A and 3B are exploded plan views schematically depicting a principal part of one example of a semiconductor device.

The semiconductor device 1 (or "semiconductor module") depicted in FIGS. 1 and 2 includes at least one semiconductor element 2 (in this example two semiconductor elements 2 are visible in the plan view and one in the cross-sectional view), and two conductor layers 3 and 4 that face each other with the semiconductor element(s) 2 in between.

Various semiconductor elements (or "semiconductor chips") may be used as the semiconductor elements 2. As examples, semiconductor chips including IGBT, MOSFET, power MOSFET, JFET (Junction Field Effect Transistors), and HEMT (High Electron Mobility Transistors) are used as the semiconductor elements 2. Reverse-blocking IGBT (or "RB-IGBT") that have a reverse breakdown voltage may be used. It is also possible to connect diodes (freewheel diodes or "FWD") in anti-parallel or to use reverse conducting IGBT (or "RC-IGBT") where an FWD is included in a semiconductor chip.

When the semiconductor device 1 includes a plurality of semiconductor elements 2 (in this example, two), it is possible to use the same kind of semiconductor elements 2 for both or to use different kinds of semiconductor elements 2.

Various conductor materials are used for the conductor layer 3 and the conductor layer 4 which face each other with the semiconductor elements 2 in between. As examples, conductor materials such as copper (Cu), silver (Ag), or aluminum (Al) are used for the conductor layer 3 and the conductor layer 4. As one example, conductor layers with the same or similar shapes and sizes are used as the conductor layer 3 and the conductor layer 4. For convenience, the conductor layers 3 and 4 which have slightly different two-dimensional sizes are depicted in FIG. 1. Conductor layers of various forms, such as conductor plates, conductor foil, conductor sheets, and conductor films may be used as the conductor layer 3 and the conductor layer 4. The conductor layer 3 and the conductor layer 4 may be provided on insulating boards.

As depicted in FIGS. 1, 2, and FIG. 3A, each semiconductor element 2 includes a positive electrode-side main electrode (or simply "positive electrode") 2a that is provided on one main surface and a negative electrode-side main electrode (or simply "negative electrode") 2b and a control electrode 2c that are provided on the other main surface. As one example, the positive electrode 2a functions as a collector electrode or a drain electrode, the negative electrode 2b functions as an emitter electrode or a source electrode, and the control electrode 2c functions as a base electrode or a gate electrode.

The two semiconductor elements 2 are provided between the facing conductor layers 3 and 4, with the positive electrodes 2a and the negative electrodes 2b of the semiconductor elements 2 provided so as to face the conductor layer 3 side and the conductor layer 4 side, respectively. As depicted in FIGS. 1 and 2, the respective positive electrodes 2a of the two semiconductor elements 2 and the conductor layer 3 and the respective negative electrodes 2b and the conductor layer 4 are electrically and mechanically connected via a bonding material 5, such as solder or a sintered material of copper, silver, or the like. Aside from the bonding material 5, a conductor material, such as a metal block with certain electric conductivity and thermal conductivity, may be interposed between the positive electrodes 2a and the conductor layer 3 and between the negative electrodes 2b and the conductor layer 4.

As depicted in FIGS. 1, 2, and 3A, a positive electrode-side terminal (or "positive electrode terminal") 3a is provided on the conductor layer 3 that is connected to the positive electrodes 2a of the semiconductor elements 2. For convenience, the positive electrode terminal 3a provided on the conductor layer 3 is schematically depicted in FIG. 2 using dotted lines. The positive electrode terminal 3a is provided at an edge portion 3b of the conductor layer 3 in the direction D1. As examples, the positive electrode terminal 3a is electrically and mechanically connected to the conductor layer 3 using solder or a sintered material such as copper, silver or the like, or by ultrasonic bonding. As depicted in FIGS. 1 and 3A as an example, a cutout portion 3d is provided in an edge portion 3c in the direction D2 that is opposite (when looking from above) the edge portion 3b in the direction D1 to which the positive electrode terminal 3a is connected. In FIGS. 1 and 3A, an example where the cutout portion 3d is provided between two semiconductor elements 2 whose positive electrodes 2a are connected to the conductor layer 3 is depicted.

As depicted in FIGS. 1, 2, and 3B, a negative electrode-side terminal (or "negative electrode terminal") 4a is provided on the other conductor layer 4 that is connected to the negative electrodes 2b of the semiconductor elements 2. The negative electrode terminal 4a is provided at an edge portion 4b of the conductor layer 4 in the direction D1. As examples, the negative electrode terminal 4a is electrically and mechanically connected to the conductor layer 4 by solder or a sintered material such as copper, silver, or the like, or by ultrasonic bonding.

FIG. 3A schematically depicts a principal part of the conductor layer 3 to which the semiconductor elements 2 (and control wiring 6, wires 7, and a control terminal 8, described later) are connected by way of a plan view when looking from the side with the semiconductor elements 2. FIG. 3B schematically depicts the conductor layer 4 provided facing the conductor layer 3 with the semiconductor element 2 in between (the conductor layer 3 is provided on the opposite side in the depth direction with respect to the plane of the drawing) by way of a plan view of the principal part when looking from the opposite side to the side with the semiconductor elements 2.

As depicted in FIGS. 1, 2, and 3A, the semiconductor device 1 includes the control wiring 6 which is provided separately to the conductor layer 3 and the conductor layer 4 at the position of the cutout portion 3d of the conductor layer 3 which is connected to the positive electrodes 2a of the two semiconductor elements 2. The control wiring 6 extends in the direction D2 to the outside of the edge portion 3c of the conductor layer 3 and the outside of the edge portion 4c of the conductor layer 4. The control electrodes 2c of the two semiconductor elements 2 are electrically and mechanically connected to the control wiring 6 using the wires 7. For convenience, the control wiring 6 positioned in this way in the cutout portion 3d of the conductor layer 3 and the wires 7 that connect the control electrodes 2c of the semiconductor elements 2 and the control wiring 6 are schematically depicted in FIG. 2 using dotted lines.

As depicted in FIGS. 1, 2, and 3A, the semiconductor device 1 further includes a control terminal 8 that is electrically and mechanically connected to the control wiring 6. Although not illustrated here, the control wiring 6 and the control terminal 8 may be connected by wire bonding, for example. As other methods, the control wiring 6 and the control terminal 8 may be connected by soldering, ultrasonic bonding, or the like. As depicted in FIGS. 1, 2, and 3A, the control terminal 8 is provided so as to be positioned outside the conductor layer 3 and the conductor layer 4 when looking both from above and from the side. As depicted in FIGS. 1 and 3A, the control terminal 8 has an end portion 8a which when looking from above appears to be aligned with the positive electrode terminal 3a and the negative electrode terminal 4a. As one example, the control terminal 8 extends in an L-shape along the outer edges of the conductor layer 3 and the conductor layer 4 when looking from above, with the end portion 8a being formed so as to protrude from the edge portion 3b of the conductor layer 3 where the positive electrode terminal 3a is provided and the edge portion 4b of the conductor layer 4 where the negative electrode terminal 4a is provided. Note that so long as the control terminal 8 is positioned outside the conductor layers 3 and 4, the shape of the control terminal 8 is not limited to being L-shaped in two dimensions as in this example.

In the semiconductor device 1, the width and thickness of the control terminal 8 are set for example based on the current that flows through the control terminal 8. The intervals between the control terminal 8 and the conductor layers 3 and 4 are set for example based on the voltage applied to the control terminal 8, the voltages applied to the conductor layer 3 and the conductor layer 4, and insulation distances that depend on these voltages.

Although an example where the cutout portion 3d is provided in the conductor layer 3 is described here, in place of the cutout portion 3d, it is also possible to provide an opening (or hole) which is surrounded by the conductor layer 3. As the control wiring 6, aside from line-type wiring that extends from the inside of the cutout portion 3d to outside the conductor layer 3, it is also possible to provide island-shaped lands in the cutout portion 3d or in the opening described above and to also provide wires for wire bonding the lands to the control terminal 8. In this configuration, the lands and wires function as the control wiring 6.

A lead frame may be used for the conductor layer 3, the combination of the conductor layer 3 and the positive electrode terminal 3a, the combination of the conductor layer 3 and the control wiring 6, or the combination of the conductor layer 3, the control wiring 6, and the control terminal 8. In the same way, a lead frame may be used for the conductor layer 4 or the combination of the conductor layer 4 and the negative electrode terminal 4a.

Also, various cooling members may be thermally and mechanically connected directly or via a thermal interface material (TIM) to the main surfaces of the conductor layer 3 and the conductor layer 4 on the opposite side to the sides where the semiconductor elements 2 are provided. As examples, a cooling member that is externally provided with or without fins, a cooling member that is internally provided with a flow path (or "coolant flow path") for a liquid or gaseous coolant, and/or a cooling member that uses evaporation and condensation of an internally sealed working fluid may be connected to the conductor layer 3 and the conductor layer 4.

Figure 4:
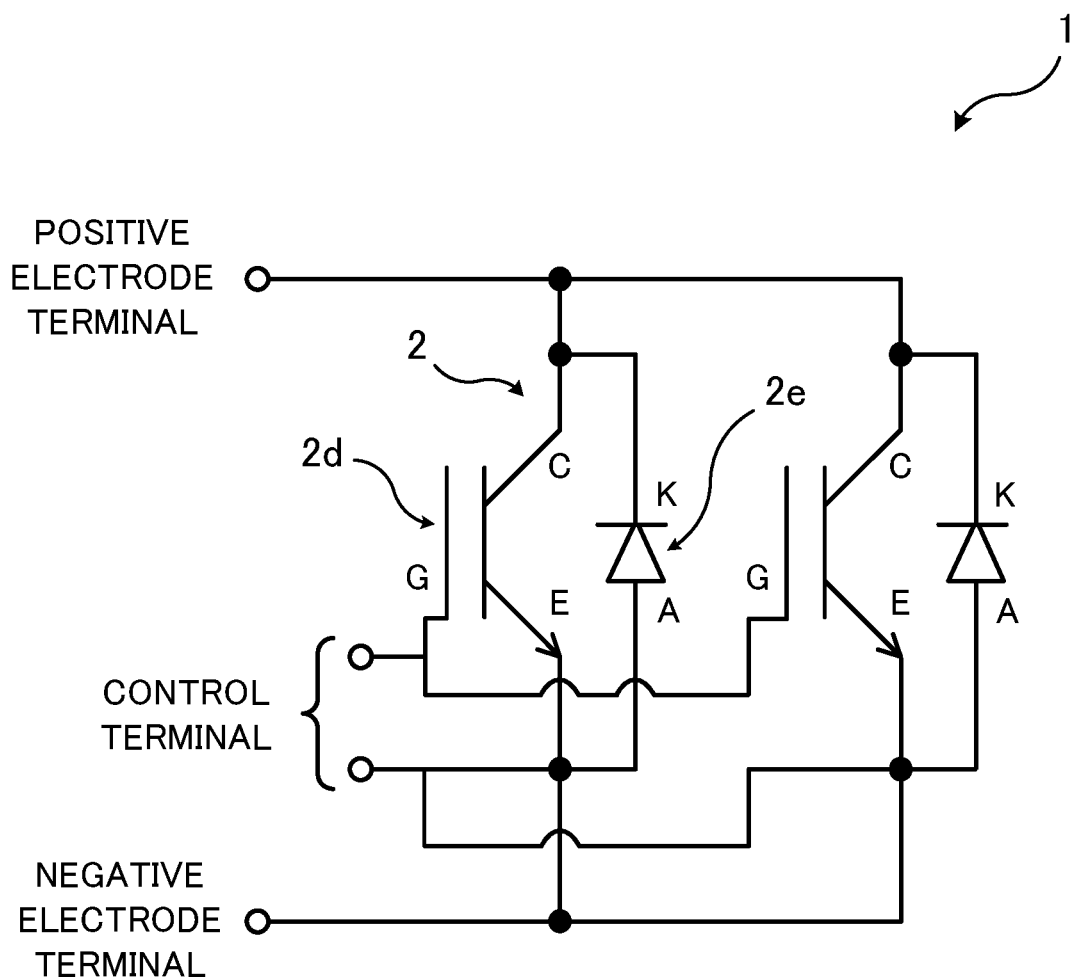
FIG. 4 depicts an example circuit of a semiconductor device.

FIG. 4 depicts one example circuit of a semiconductor device.

FIG. 4 is an equivalent circuit diagram of an example circuit that is able to be realized by the semiconductor device 1 with the configuration depicted in FIGS. 1 to 3 described above. In the example in FIG. 4, each of the two semiconductor elements 2 described above is a reverse conducting IGBT (RC-IGBT) where an IGBT 2d and an FWD 2e have been incorporated in a single semiconductor chip. In this RC-IGBT, the collector electrode C of the IGBT 2d and the cathode electrode K of the FWD 2e are connected and the emitter electrode E of the IGBT 2d and the anode electrode A of the FWD 2e are connected.

In the semiconductor device 1, as described above, the positive electrodes 2a of the two semiconductor elements 2 are electrically connected via the bonding material 5 and the like to the positive electrode terminal 3a provided on the conductor layer 3. That is, as depicted in FIG. 4, the collector electrodes C that correspond to the positive electrodes 2a of the two semiconductor elements 2 of the RC-IGBT are electrically connected to the positive electrode terminal (FIG. 4).

In the semiconductor device 1, as described above, the negative electrodes 2b of the two semiconductor elements 2 are electrically connected via the bonding material 5 and the like to the negative electrode terminal 4a provided on the conductor layer 4. That is, as depicted in FIG. 4, the emitter electrodes E that correspond to the negative electrodes 2b of the two semiconductor elements 2 of the RC-IGBT are electrically connected to the negative electrode terminal (FIG. 4).

As described above, in the semiconductor device 1, the control electrodes 2c of the two semiconductor elements 2 are electrically connected via the wires 7 and the control wiring 6 to the control terminal 8. In the semiconductor device 1 that has two semiconductor elements 2 that are RC-IGBT, since predetermined voltages are applied across the control electrodes 2c and the negative electrodes 2b of the two semiconductor elements 2, the negative electrodes 2b of the two semiconductor elements 2 are also electrically connected in the same way as described above via the wires 7 and the control wiring 6 to the control terminal 8. That is, as depicted in FIG. 4, the gate electrodes G that correspond to the control electrodes 2c of the two semiconductor elements 2 that are RC-IGBT are electrically connected to the control terminal, and the emitter electrodes E that correspond to the negative electrodes 2b of the two semiconductor elements 2 are electrically connected to the control terminal (FIG. 4).

Note that although a sensing electrode at the same potential as the negative electrode may be used as a negative electrode that is electrically connected to the control terminal, a configuration that uses a negative electrode that is integrated with a sensing electrode will be described in the following embodiments.

When RC-IGBT are used as described above for the two semiconductor elements 2, the control wiring 6 and the control terminal 8 of the semiconductor device 1 include two control signal paths for applying a predetermined voltage across the gate electrode G and the emitter electrode E, that is, a control signal path that connects the gate electrode G and the control terminal and a control signal path that connects the emitter electrode E to the control terminal.

As one example, the semiconductor device 1 may be configured to include a circuit in which two semiconductor elements 2 that are RC-IGBT are connected in parallel as depicted in FIG. 4.

When the semiconductor device 1 depicted in FIGS. 1 and 2 is operating, a predetermined voltage is applied between the control electrodes 2c (the gate electrodes G) and the negative electrodes 2b (the emitter electrodes E) of the two semiconductor elements 2 and a predetermined voltage is applied between the positive electrodes 2a (the collector electrodes C) and the negative electrodes 2b (the emitter electrodes E) of the two semiconductor elements 2.

When the semiconductor elements 2 are switched from off to on, a voltage equal to a predetermined on voltage is applied. When this happens, a current for charging the gate flows from the control terminal 8 to the control electrodes 2c and a current flows from the negative electrodes 2b to the control terminal 8. As a result, the semiconductor elements 2 enter an on state, a current flows from the positive electrode terminal 3a to the positive electrodes 2a (the collector electrodes C) of the two semiconductor elements 2, and a current flows from the negative electrodes 2b of the two semiconductor elements 2 to the negative electrode terminal 4a.

Conversely, when the semiconductor elements 2 are switched from on to off, a predetermined off voltage that is lower than the on voltage is applied. When this happens, a current for discharging the gates flows from the control electrodes 2c to the control terminal 8, and a current flows from the control terminal 8 to the negative electrodes 2b. As a result, the semiconductor elements 2 enter an off state, the current from the positive electrode terminal 3a to the positive electrodes 2a (the collector electrodes C) of the two semiconductor elements 2 is stopped, and the current from the negative electrodes 2b of the two semiconductor elements 2 to the negative electrode terminal 4a is also stopped.

Here, the current that flows in this way from the control terminal 8 to the semiconductor elements 2 and from the semiconductor elements 2 to the control terminal 8 is referred to as the "control current 9a" and is schematically depicted by thick arrows in FIGS. 1 and 2. The current flowing out from the positive electrode terminal 3a to the negative electrode terminal 4a is referred to as the "main current 9b" and is also schematically depicted by thick arrows in FIGS. 1 and 2.

In the semiconductor device 1, as depicted in FIGS. 1 and 2, the main current 9b flows to the two semiconductor elements 2 interposed between the conductor layer 3 and the conductor layer 4 so as to flow in from the positive electrode terminal 3a provided on the edge portion 3b side in the direction D1 of the conductor layer 3 and flow out from the negative electrode terminal 4a provided on the edge portion 4b side in the direction D1 of the conductor layer 4. The control wiring 6 extends outside the conductor layer 3 and the conductor layer 4 in the direction D2, that is, toward the opposite side to the main current 9b that flows as described above. The control terminal 8 is connected to this control wiring 6. The control terminal 8 is provided along the outer edges of the conductor layer 3 and the conductor layer 4 so as to be positioned outside the conductor layer 3 and the conductor layer 4 where the main current 9b flows, and the end portion 8a is provided so as to be positioned on the same side as the positive electrode terminal 3a and the negative electrode terminal 4a through which the main current 9b flows. The control current 9a flows through the control terminal 8 provided in this way.

By using this configuration, in the semiconductor device 1, the control current 9a that flows through the control terminal 8 is less susceptible to being affected by the electromagnetic field caused by the main current 9b flowing through the conductor layer 3 provided with the positive electrode terminal 3a and the conductor layer 4 provided with the negative electrode terminal 4a, which makes the control voltage less susceptible to being affected by the main current 9b. In the semiconductor device 1, by suppressing the influence of the electromagnetic field caused by the main current 9b on the control current 9a and the control voltage, it is possible to improve the controllability of the semiconductor elements 2 that operate due to the control current 9a flowing to the control electrode 2c through the application of a control voltage. In addition, by providing the control terminal 8 outside of and along the outer edges of the conductor layers 3 and 4, the influence of electromagnetic fields is suppressed, the controllability of the semiconductor elements 2 is improved, and an increase in the size of the semiconductor device 1 is suppressed.

By using the configuration described above, a compact semiconductor device 1 in which the semiconductor elements 2 have superior operation performance is realized.

Also, with the semiconductor device 1, by providing the conductor layers 3 and 4 on both main surface sides of the semiconductor elements 2, compared to a configuration where a conductor layer is provided on only one main surface side, heat dissipation efficiency and cooling efficiency of the semiconductor elements 2 are improved. By doing so, overheating of the semiconductor elements 2 is suppressed, damage to the semiconductor elements 2 due to overheating is suppressed, and it is possible to pass larger currents through the semiconductor elements 2.

Also, in the semiconductor device 1, since the control wiring 6, which is connected to the semiconductor elements 2 by the wires 7, is provided between the two semiconductor elements 2, the current paths on which the control current 9a flows to the two semiconductor elements 2 are equalized in length. By doing so, oscillation may be suppressed and the controllability of operations by the semiconductor elements 2 is able to be improved.

In the semiconductor device 1, the positive electrode terminal 3a and the negative electrode terminal 4a are respectively provided on the conductor layers 3 and 4 on both main surface sides of the semiconductor elements 2, the end portion 8a of the control terminal 8 is provided in the same layer as the conductor layer 3, and the negative electrode terminal 4a is disposed between the end portion 8a and the positive electrode terminal 3a. When viewed from the side, the end portion 8a of the control terminal 8, the positive electrode terminal 3a, and the negative electrode terminal 4a have a staggered arrangement. By using this terminal arrangement, in addition to miniaturizing the semiconductor device 1, it is also possible to miniaturize semiconductor devices (electronic devices) in which a plurality of semiconductor devices 1 are connected.

Second Embodiment

Figure 5:
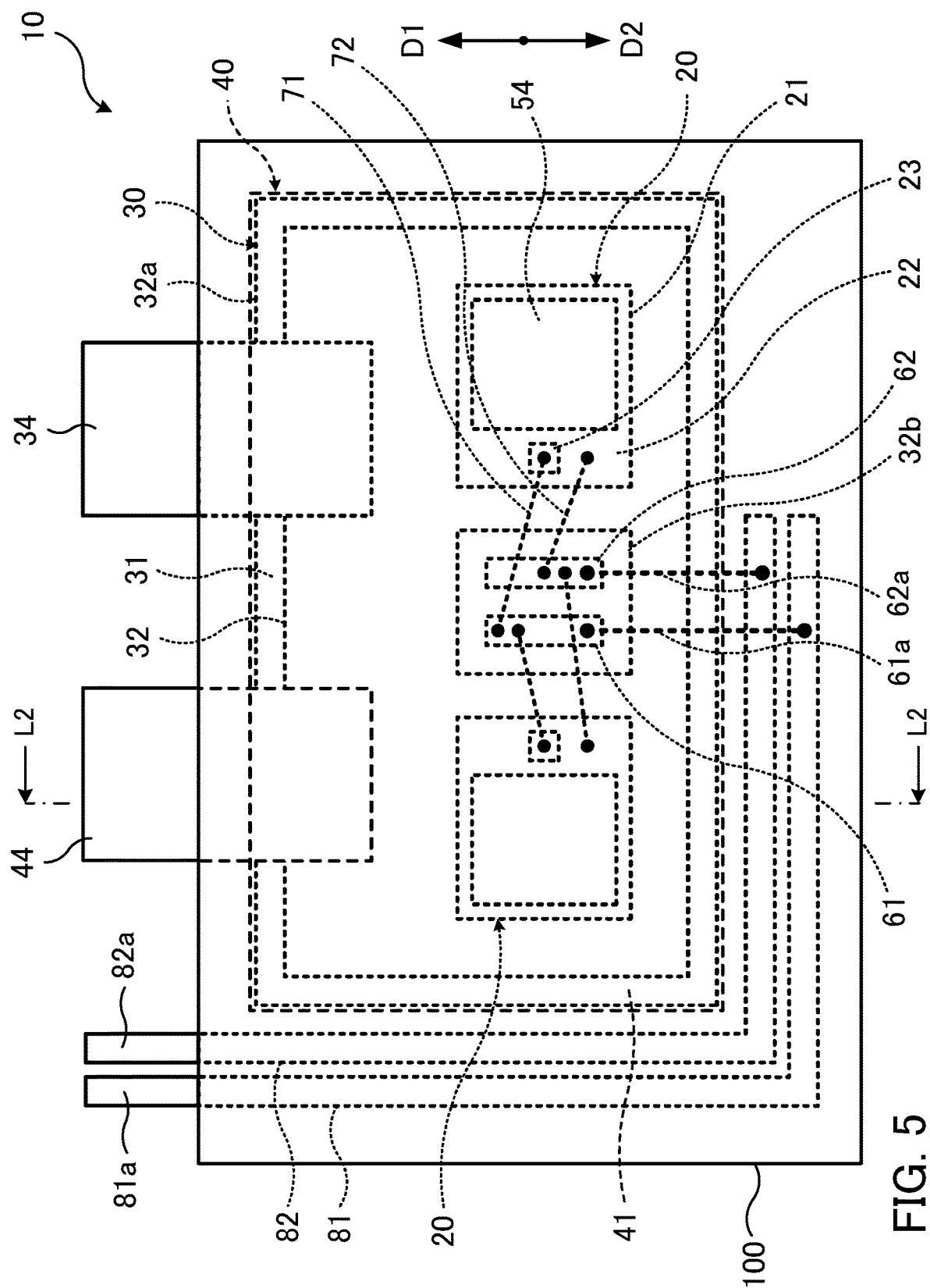
FIG. 5 depicts one example of a semiconductor device according to a second embodiment.
Figure 6:
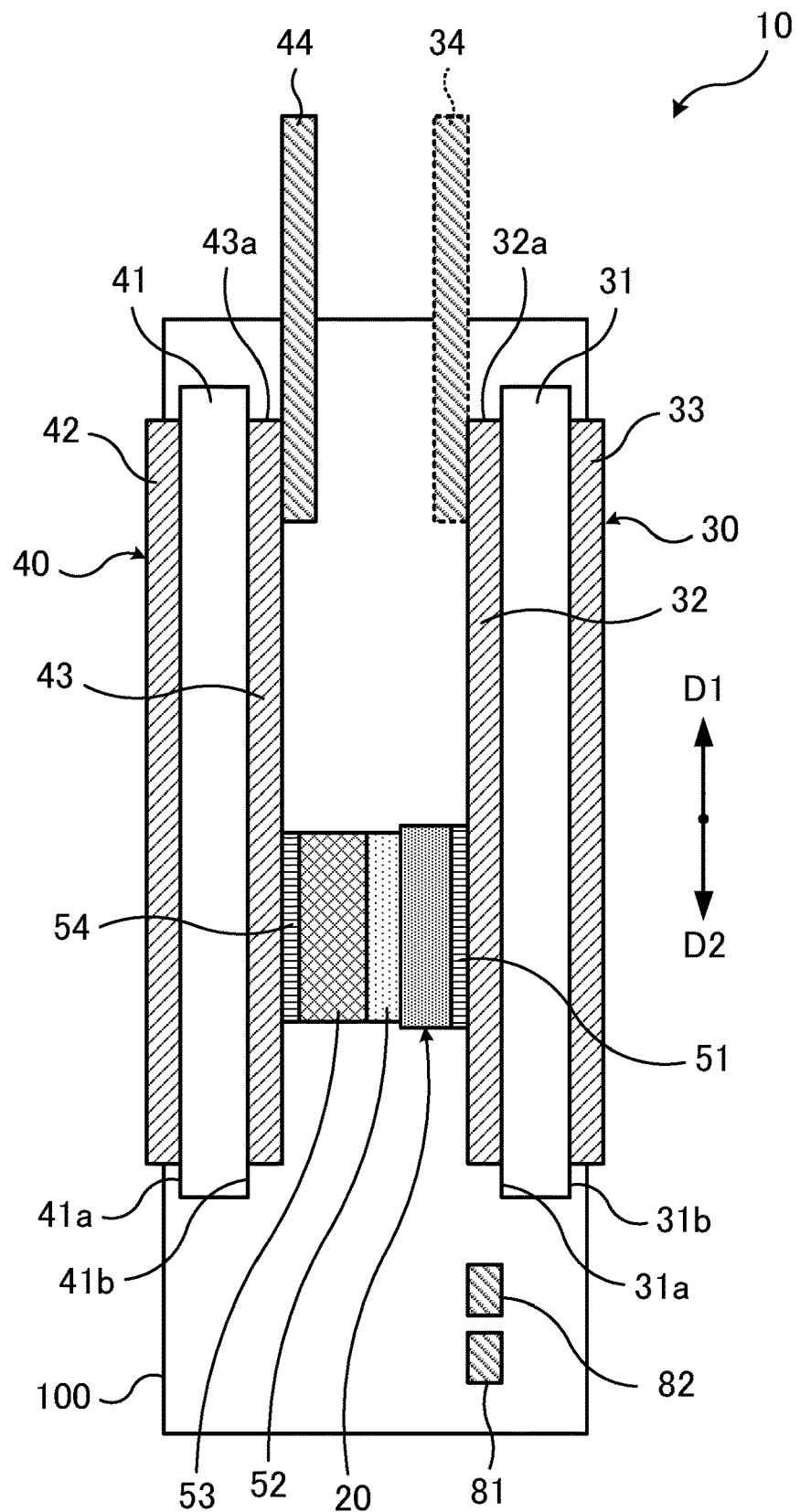
FIG. 6 depicts the same example of a semiconductor device according to the second embodiment.
Figure 7:
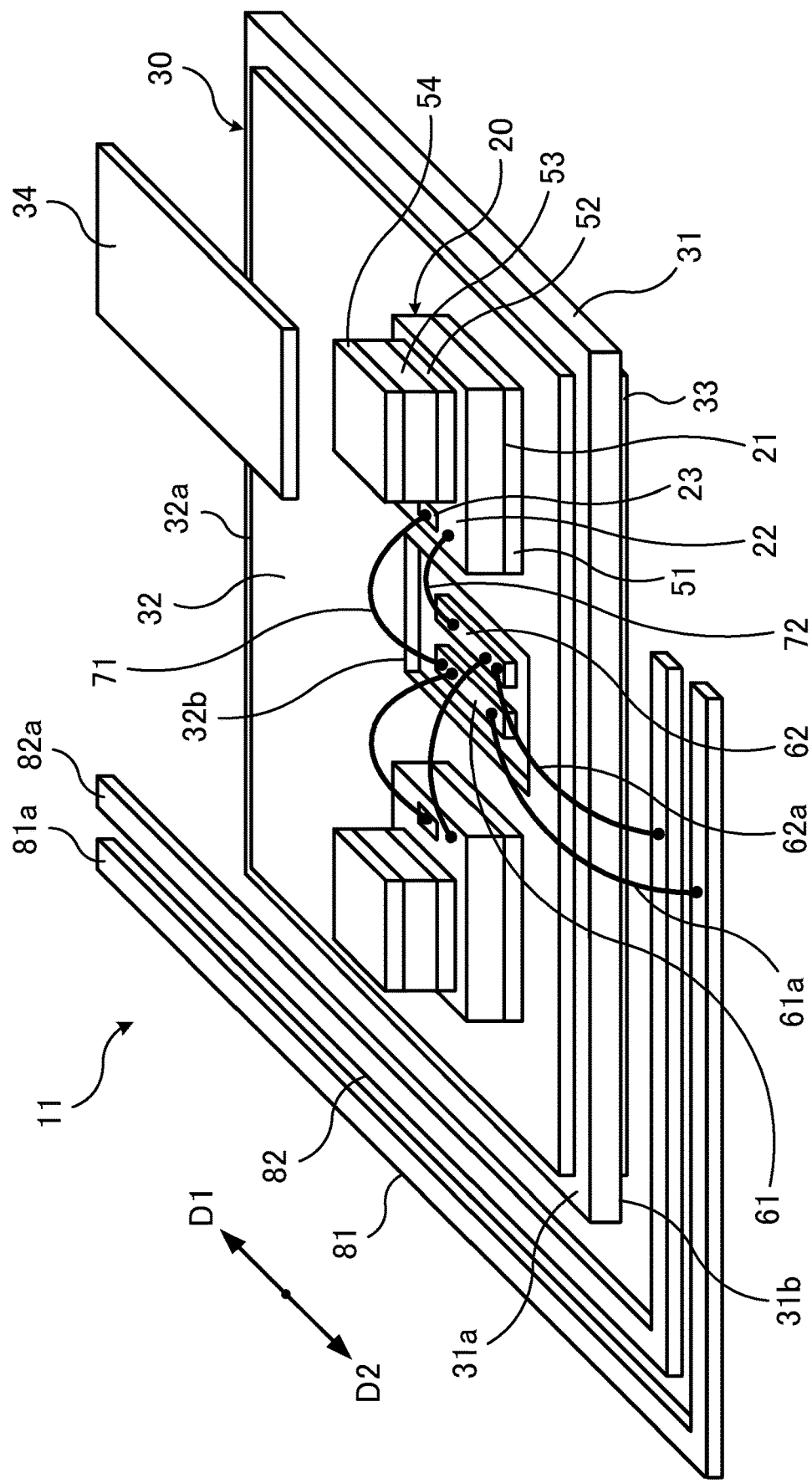
FIG. 7 depicts the same example of a semiconductor device according to the second embodiment.
Figure 8:
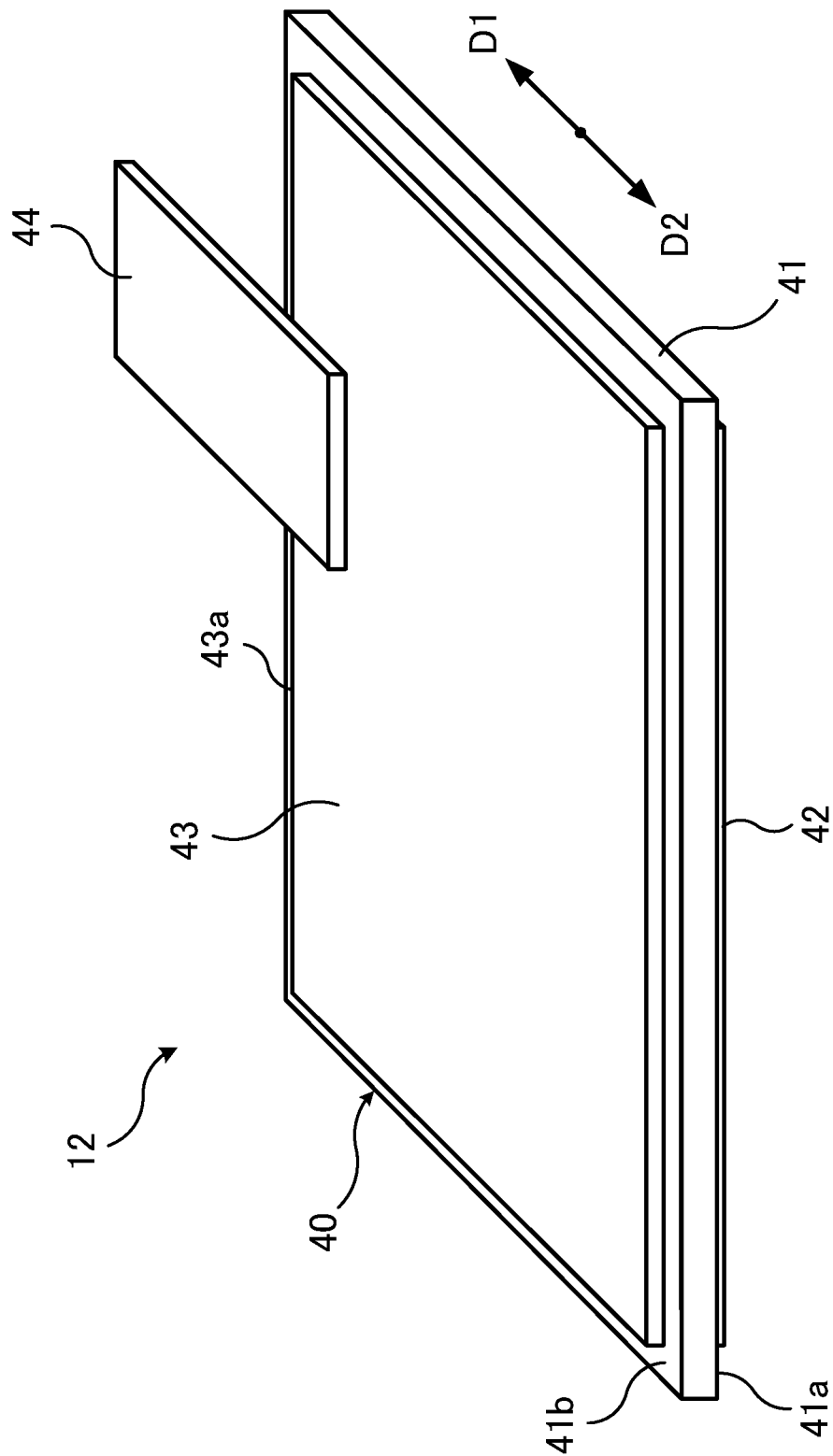
FIG. 8 depicts the same example of a semiconductor device according to the second embodiment.

FIG. 5 to FIG. 8 depict one example of a semiconductor device according to a second embodiment. FIG. 5 is a schematic plan view depicting a principal part of one example of a semiconductor device. FIG. 6 is a schematic cross-sectional view taken along a line L2-L2 in FIG. 5. FIGS. 7 and 8 are exploded perspective views schematically depicting a principal part of one example of a semiconductor device.

The semiconductor device 10 (or "semiconductor module") depicted in FIGS. 5 and 6 includes at least one semiconductor element 20 (in this example two semiconductor elements 20 are visible in the plan view and one in the cross-sectional view), and a substrate 30 and a substrate 40 that face each other with the semiconductor element(s) 20 in between.

Various semiconductor elements (or "semiconductor chips") may be used as the semiconductor elements 20. As examples, semiconductor chips including IGBT, MOSFET, power MOSFET, JFET, and HEMT are used as the semiconductor elements 20. RB-IGBT that have a reverse breakdown voltage may be used. It is also possible to connect FWD in anti-parallel or to use RC-IGBT where an FWD is included in a semiconductor chip.

When the semiconductor device 10 includes a plurality of semiconductor elements 20 (in this example, two), it is possible to use the same kind of semiconductor elements 20 for both or to use different kinds of semiconductor elements 20.

As one example, a configuration where semiconductor elements 20 that each include an IGBT and an FWD connected to the IGBT are used in the semiconductor device 10 will be described here.

As depicted in FIGS. 5, 6, and 7, the substrate 30 includes an insulating board 31, a conductor layer 32 provided on one main surface 31a of the insulating board 31, and a conductor layer 33 provided on another main surface 31b of the insulating board 31. Note that for convenience, the conductor layer 33 provided on the other main surface 31b of the insulating board 31 of the substrate 30 has been omitted from FIG. 5. The semiconductor elements 20 are provided on the conductor layer 32 side of the substrate 30.

As the insulating board 31, a substrate made of various insulating materials with certain thermal conductivity is used. As one example, as the insulating board 31, a ceramic substrate with favorable thermal conductivity, such as aluminum oxide, aluminum nitride, or silicon nitride, is used.

The conductor layer 32 has an opening 32b provided between the regions where the two semiconductor elements 20 are mounted. Inside the opening 32b, two lands, a land 61 and a land 62, are provided so as to be separate from the edge of the opening 32b (that is, separate from the conductor layer 32). As one example, the land 61 and the land 62 are provided in the same layer as the conductor layer 32 on the main surface 31a of the insulating board 31. As the conductor layer 32 and the lands 61 and 62, various conductor materials that have certain electric conductivity and thermal conductivity are used. As one example, a conductor material that has favorable electrical conductivity such as copper or copper alloy is used as the conductor layer 32 and the lands 61 and 62. A surface treatment layer of nickel (Ni), nickel alloy, gold (Au) or the like may be provided on the surfaces of the conductor layer 32 and the lands 61 and 62 formed using this material to improve corrosion resistance.

As the conductor layer 33, various conductor materials that have certain thermal conductivity are used. As one example, as the conductor layer 33, a material with favorable thermal conductivity, such as copper, silver, aluminum, iron (Fe), or an alloy containing at least one of these metals, is used. A surface treatment layer of nickel, gold, or the like may be provided on the surface of the conductor layer 33 to improve corrosion resistance.

As one example, the conductor layer 32 of the substrate 30 and the lands 61 and 62 are able to be produced by patterning a conductor layer provided on the main surface 31a of the insulating board 31 by etching or the like. A lead frame may be used as the conductor layer to be patterned. Alternatively, the conductor layer 32, the land 61, and the land 62 may be bonded to the main surface 31a of the insulating board 31 using a suitable bonding method.

In the substrate 30, the conductor layer 32 and the lands 61 and 62 are provided with a thickness of 0.2 mm to 1 mm, for example. The conductor layer 33 is provided with the same thickness as or a different thickness to the conductor layer 32 (and the land 61 and the land 62). The insulating board 31 is provided with a sufficient thickness for electrically insulating the conductor layer 32 and the conductor layer 33 from each other, for example, a thickness of 0.2 mm to 1 mm.

As depicted in FIGS. 5, 6 and 8, the substrate 40 includes an insulating board 41, a conductor layer 42 provided on one main surface 41a of the insulating board 41, and a conductor layer 43 provided on the other main surface 41b of the insulating board 41. Note that for convenience, the conductor layers 42 and 43 on the insulating board 41 of the substrate 40 have been omitted from FIG. 5. The semiconductor elements 20 are provided on the conductor layer 43 side of the substrate 40.

As the insulating board 41, a substrate made of various insulating materials with certain thermal conductivity is used. As one example, as the insulating board 41, a ceramic substrate with favorable thermal conductivity, such as aluminum oxide, aluminum nitride, or silicon nitride, is used.

As the conductor layer 42, various conductor materials that have certain thermal conductivity are used. As one example, a conductor material that has favorable thermal conductivity, such as copper, silver, aluminum, iron, or an alloy containing at least one of these metals, is used as the conductor layer 42. A surface treatment layer of nickel, gold, or the like may be provided on the surface of the conductor layer 42 to improve corrosion resistance.

As the conductor layer 43, various conductor materials that have certain electric conductivity and thermal conductivity are used. As one example, as the conductor layer 43, a conductor material with favorable electrical conductivity, such as copper or copper alloy, is used. A surface treatment layer of nickel, gold, or the like may be provided on the surface of the conductor layer 43 to improve corrosion resistance.

In the substrate 40, the conductor layer 43 is provided with a thickness of 0.2 mm to 1 mm, for example. The conductor layer 42 is provided with the same thickness as or a different thickness to the conductor layer 43. The insulating board 41 is provided with a sufficient thickness for electrically insulating the conductor layer 43 and the conductor layer 42 from each other, for example, a thickness of 0.2 mm to 1 mm.

When joining the conductor layers 32 and 33 of the substrate 30 to the insulating board 31 and joining the conductor layers 42 and 43 of the substrate 40 to the insulating board 41 depicted in FIGS. 5 to 8 described above, as examples direct bonding may be used as with a DCB (Direct Copper Bonding) substrate or brazing may be used as with an AMB (Active Metal Brazed) substrate.

As depicted in FIGS. 5, 6, and 7, the two semiconductor elements 20 each have a collector electrode 21 (positive electrode) provided on one main surface and an emitter electrode 22 (negative electrode) and a gate electrode 23 (control electrode) provided on the other main surface.

The two semiconductor elements 20 are provided between the substrate 30 and the substrate 40 that face each other, with the collector electrodes 21 and the emitter electrodes 22 respectively provided on the substrate 30 side and the substrate 40 side. The substrate 30 and the substrate 40 are provided so that the conductor layers 32 and 43 face each other. The collector electrodes 21 of the two semiconductor elements 20 and the conductor layer 32 of the substrate 30 are electrically and mechanically connected to each other for example via a bonding material 51 made of solder or a sintered material, such as copper or silver. The emitter electrodes 22 of the two semiconductor elements 20 and the conductor layer 43 of the substrate 40 are electrically and mechanically connected to each other for example via a bonding material 52 made of solder or the like, a metal block 53 of copper or the like, and a bonding material 54 such as solder or a sintered material like copper or silver.

Note that the metal block 53 has a height adjusting function for preventing the wires 71 and the wires 72, which respectively connect the semiconductor elements 20 and the land 61 and the land 62 as described later, from interfering with the substrate 40, and a heat conducting function for transferring heat generated in the semiconductor elements 20 to the substrate 40.

As depicted in FIGS. 5, 6, and 7, a positive electrode terminal 34 is provided on the conductor layer 32 of the substrate 30 connected to the collector electrodes 21 of the semiconductor elements 20. For convenience, the positive electrode terminal 34 is schematically depicted by dotted lines in FIG. 6. As the positive electrode terminal 34, various conductor materials with certain electric conductivity, as examples conductor materials such as copper and copper alloy, are used. The positive electrode terminal 34 is provided on an edge portion 32a in the direction D1 of the conductor layer 32. As examples, the positive electrode terminal 34 is electrically and mechanically connected to the conductor layer 32 via solder, a sintered material, such as copper or silver, or by ultrasonic bonding.

As depicted in FIGS. 5, 6, and 8, a negative electrode terminal 44 is provided on the conductor layer 43 of the substrate 40 which is connected to the emitter electrodes 22 of the semiconductor elements 20. As the negative electrode terminal 44, various conductor materials with certain electric conductivity, for example, conductor materials such as copper and copper alloy are used. The negative electrode terminal 44 is provided on an edge portion 43a in the direction D1 of the conductor layer 43. As examples, the negative electrode terminal 44 is electrically and mechanically connected to the conductor layer 43 via solder, a sintered material, such as copper or silver, or by ultrasonic bonding.

As described above and depicted in FIGS. 5 and 7, an opening 32b is provided in the conductor layer 32 connected to the collector electrodes 21 of the two semiconductor elements 20, between the regions where the two semiconductor elements 20 are mounted. The two lands 61 and 62 are aligned inside the opening 32b so as to be separated from the edges of the opening 32b. The gate electrodes 23 of the two semiconductor elements 20 are electrically and mechanically connected to one of the lands, the land 61, using the wires 71. The emitter electrodes 22 of the two semiconductor elements 20 are electrically and mechanically connected to the other land 62 using the wires 72. As the wires 71 and 72, a conductor material with favorable electrical conductivity, such as gold, aluminum, or copper, is used.

As depicted in FIGS. 5, 6, and 7, the semiconductor device 10 further includes a control terminal 81 and a control terminal 82 provided so as to be positioned outside (the conductor layer 32 of) the substrate 30 and (the conductor layer 43 of) the substrate 40 when looking from above and in a cross-sectional view. When looking from above, the control terminal 81 and the control terminal 82 extend in parallel in an L-shape along outer edges of the substrates 30 and 40. An end portion 81a of the control terminal 81 and an end portion 82a of the control terminal 82 protrude from the outer edge in the direction D1 of the substrate 30 and the substrate 40 where the positive electrode terminal 34 and the negative electrode terminal 44 are provided, and when seen from above appear to be parallel with the positive electrode terminal 34 and the negative electrode terminal 44. When seen in cross-section, the control terminal 81 and the control terminal 82 are provided so as to be positioned in the same layer as the substrate 30, as one example, in the same layer as the conductor layer 32. As the control terminal 81 and the control terminal 82, various conductor materials with certain electric conductivity, for example, conductor materials such as copper and copper alloy are used.

As depicted in FIGS. 5 and 7, the control terminal 81 is electrically and mechanically connected to the land 61 using a wire 61a. The control terminal 82 is electrically and mechanically connected to the land 62 using a wire 62a. As the wires 61a and 62a, a conductor material with favorable electrical conductivity such as gold, aluminum, or copper is used.

In the semiconductor device 10, the land 61 and the wire 61a are control wiring that extends outside the conductor layers 32 and 43, and function as control wiring (corresponding to the control wiring 6 described in the first embodiment) that electrically connects between the gate electrodes 23 of the semiconductor elements 20 and the control terminal 81. The land 62 and the wire 62a are control wiring that extends outside the conductor layer 32 and the conductor layer 43, and function as control wiring (corresponding to the control wiring 6 described in the first embodiment) that electrically connects between the emitter electrodes 22 of the semiconductor element 20 (which are also used as one of the control electrodes) and the control terminal 82.

In the semiconductor device 10, the respective widths and thicknesses of the control terminal 81 and the control terminal 82 are set for example based on the current that flows through the control terminal 81 and the control terminal 82. The interval between the control terminal 81 and the control terminal 82 and the interval between the control terminals 81 and 82 and the conductor layers 32 and 43 are set for example based on the voltage applied to the control terminal 81 and the control terminal 82, the voltage applied to the conductor layer 32 and the conductor layer 43, and insulation distances depending on these voltages.

As depicted in FIGS. 5 and 6, the semiconductor device 10 further includes resin 100 that seals the semiconductor elements 20 and the like provided between the substrate 30 and the substrate 40. The conductor layer 33 of the substrate 30, the conductor layer 42 of the substrate 40, part of the positive electrode terminal 34, part of the negative electrode terminal 44, the end portion 81a of the control terminal 81, and the end portion 82a of the control terminal 82 are exposed from the resin 100. Aside from these parts, the structure including the semiconductor elements 20 and the like between the substrate 30 and the substrate 40 is sealed with the resin 100. As the resin 100, as examples, a thermosetting resin such as epoxy resin, phenol resin, maleimide resin, maleimide-modified epoxy resin, or maleimide-modified phenol resin is used. The resin 100 may contain a material that has a certain thermal conductivity and insulating property, as examples, a filler using a material such as aluminum oxide, aluminum nitride, silicon nitride, or silica, and/or fibers or cloth using a material such as glass.

As one example, the semiconductor device 10 with the configuration described above is able to be obtained by stacking a structure 11 like that depicted in FIG. 7 and a structure 12 like that depicted in FIG. 8 and then sealing with the resin 100 in a molding process. Note that when the structure 11 and the structure 12 are placed in a stacked arrangement, as one example, it is possible to use a method where out of the structure 11 depicted in FIG. 7, all or part of the bonding material 52, the metal block 53, and the bonding material 54 are provided in advance at predetermined positions on the conductor layer 43 side of the structure 12 depicted in FIG. 8 before the two structures are stacked. With this method, the structures are stacked via the bonding material 52. When solder is used as the bonding material 52, positioning of the substrate 30 and the substrate 40 during stacking is facilitated by a self-aligning effect produced by surface tension when the solder melts and then solidifies. By using this method, the assembly procedure is simplified and the number of manufacturing steps is reduced.

In the semiconductor device 10 with the configuration described above, when RC-IGBT including an IGBT and an FWD connected to the IGBT are used as the semiconductor elements 20, a circuit similar to the circuit depicted in FIG. 4 described above is realized. That is, in the semiconductor device 10, in each of the two semiconductor elements 20, the collector electrode C (collector electrode 21) of the included IGBT and the cathode electrode K of the FWD are connected and the emitted electrode E (emitter electrode 22) of the IGBT and the anode electrode A of the FWD are connected. These collector electrodes C are electrically connected to the positive electrode terminal (the positive electrode terminal 34) and the emitter electrodes E are electrically connected to the negative electrode terminal (the negative electrode terminal 44). The gate electrodes G are electrically connected to one of the control terminals (the control terminal 81), and the emitter electrodes E are electrically connected to one of the control terminals (the control terminal 82).

As described above, the semiconductor device 10 may be configured to include a circuit in which two semiconductor elements 20 that are RC-IGBT are connected in parallel, for example.

When the semiconductor device 10 is operating, a predetermined voltage is applied across the gate electrode 23 and the emitter electrode 22 of each of the two semiconductor elements 20, and a predetermined voltage is applied across the collector electrode 21 and the emitter electrode 22 of each of the two semiconductor elements 20.

Figure 9:
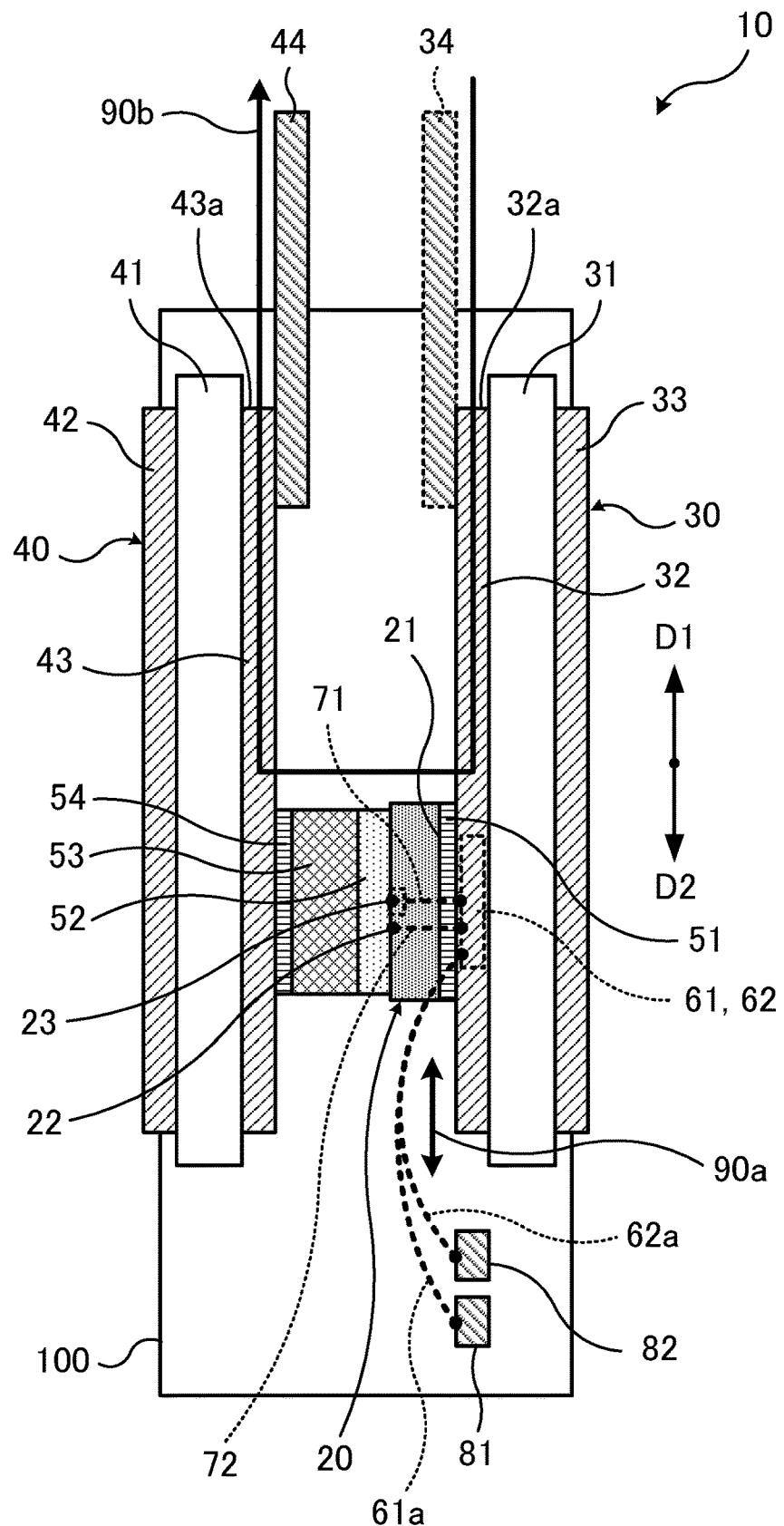
FIG. 9 depicts currents that flow when the semiconductor device according to the second embodiment operates.

FIG. 9 depicts the currents that flow when the semiconductor device according to the second embodiment is oper-ating. FIG. 9 is a cross-sectional view schematically depicting a principal part of one example of a semiconductor device.

In FIG. 9, the currents that flow when the semiconductor device 10 is operating are schematically depicted using thick arrows. For convenience, the wires 71 and 72, the land 61 and the land 62, and the wire 61a and the wire 62a are schematically depicted by dotted lines in FIG. 9.

When the semiconductor device 10 is operating, a predetermined voltage is applied across the control terminal 81, which is connected to the gate electrodes 23 of the two semiconductor elements 20, and the control terminal 82, which is connected to the gate electrodes 23 and the emitter electrodes 22 that also serve as one of the control electrodes (sensing electrode). When the semiconductor elements 20 are switched from off to on, an on voltage is applied so that a predetermined current for charging the gates flows into the gate electrodes 23 of the two semiconductor elements 20 from the control terminal 81 through the wire 61a, the land 61, and the wires 71 and a predetermined current flows out from the emitter electrodes 22 of the two semiconductor elements 20 via the wires 72, the land 62 and the wire 62a to the control terminal 82. Conversely, when switching from on to off, an off voltage that is lower than the on voltage is applied, so that a predetermined current for discharging the gates flows out via the wire 61a, the land 61, and the wires 71 from the gate electrodes 23 of the two semiconductor elements 20 to the control terminal 81 and a predetermined current flows from the control terminal 82 via the wire 62a, the land 62, and the wires 72 into the emitter electrodes 22 of the two semiconductor elements 20.

Note that the wire 61a and the land 61 are an example form of gate wiring that is electrically connected to the gate electrodes 23, and the land 62 and the wire 62a are an example form of sensing wiring that is electrically connected to the emitter electrodes 22 that function as sensing electrodes. The control terminal 81 is an example form of a gate terminal line that is electrically connected to the gate wiring, and the control terminal 82 is an example form of a sensing terminal line that is electrically connected to the sensing wiring.

When the semiconductor device 10 is operating, a predetermined voltage is also applied between the positive electrode terminal 34 connected to the collector electrodes 21 of the two semiconductor elements 20 and the negative electrode terminal 44 connected to the emitter electrodes 22. When the semiconductor elements 20 are on, a predetermined current flows from the positive electrode terminal 34 via the conductor layer 32 and the bonding material 51 into the collector electrodes 21 of the two semiconductor elements 20, and a predetermined current flows out from the emitter electrodes 22 of the two semiconductor elements 20 via the bonding material 52, the metal block 53, the bonding material 54, and the conductor layer 43 into the negative electrode terminal 44. When the semiconductor elements 20 are off, these currents are stopped.

Here, the current flowing in this way from the control terminal 81 to the semiconductor elements 20 and from the semiconductor elements 20 to the control terminal 82 is the "control current 90a", which is schematically depicted in FIG. 9 by a thick arrow. The current that flows in from the positive electrode terminal 34 and flows out to the negative electrode terminal 44 is the "main current 90b" and is also schematically depicted in FIG. 9 by a thick arrow.

In the semiconductor device 10, the main current 90b flows to the two semiconductor elements 20 interposed between the conductor layer 32 of the substrate 30 and the conductor layer 43 of the substrate 40 by flowing in from the positive electrode terminal 34 provided on the edge portion 32a side in the direction D1 of the conductor layer 32 and flowing out to the negative electrode terminal 44 provided on the edge portion 43a side in the direction D1 of the conductor layer 43. The land 61 and the wire 61a that function as the control wiring extend out on the opposite side to the side where the main current 90b flows in and out, or in other words, in the direction D2, and are connected to the control terminal 81. In addition, the land 62 and the wire 62a that also function as control wiring extend out in the direction D2 on the opposite side to the side where the main current 90b flows in and out and are connected to the control terminal 82. The control terminal 81 and the control terminal 82 are provided along the outer edges of the conductor layer 32 and the conductor layer 43 so as to be positioned outside the conductor layer 32 and the conductor layer 43 through which the main current 90b flows, and the end portion 81a and the end portion 82a are provided so as to be positioned on the same side as the positive electrode terminal 34 and the negative electrode terminal 44 of the main current 90b. The control current 90a flows through the control terminal 81 and the control terminal 82 that are provided in this way.

By using this configuration, in the semiconductor device 10, the control current 90a that flows through the control terminal 81 and the control terminal 82 is less susceptible to being affected by the magnetic field of the main current 90b that flows between the conductor layer 32 where the positive electrode terminal 34 is provided and the conductor layer 43 where the negative electrode terminal 44 is provided, which makes the control voltage less susceptible to being affected by the main current 90b. In the semiconductor device 10, by suppressing the influence of the electromagnetic field of the main current 90b on the control current 90a, it is possible to improve the controllability of operations of the semiconductor elements 20 that operate due to the application of a control voltage and the resulting control current 90a flowing between the gate electrodes 23 and the emitter electrodes 22. In addition, in the semiconductor device 10, by providing the control terminal 81 and the control terminal 82 outside the conductor layers 32 and 43 along the outer edges and providing the end portions 81a and 82a so as to be positioned on the same side as the positive electrode terminal 34 and the negative electrode terminal 44, the influence of electromagnetic fields is suppressed, which improves the controllability of the semiconductor elements 20, and suppresses an increase in the size of the semiconductor device 10.

By using the configuration described above, a compact semiconductor device 10 in which the semiconductor elements 20 have superior operation performance is realized.

In the semiconductor device 10, the semiconductor elements 20 generate heat during operation. The semiconductor device 10 is constructed with the substrate 30 and the substrate 40 provided on both main surface sides of the semiconductor elements 20 and with the conductor layers 33 and 42 on the outer sides of the substrates 30 and 40 both exposed from the resin 100. With the semiconductor device 10, compared to a configuration where a substrate and a conductor layer exposed from the resin 100 are provided only on one main surface side, the heat dissipation efficiency and the cooling efficiency of the semiconductor elements 20 are improved. As a result, overheating of the semiconductor elements 20 may be suppressed, damage to the semiconductor elements 20 due to overheating may be suppressed, and it is possible to pass larger currents through the semiconductor elements 20.

The semiconductor device 10 is configured with the land 61 and the wire 61a, which are connected via the wires 71 to the semiconductor elements 20, and the land 62 and the wire 62a, which are connected via the wires 72 to the semiconductor elements 20, provided between the two semiconductor elements 20. In the semiconductor device 10, due to the wires 71 and the wires 72, the land 61 and the land 62, and the wire 61a and the wire 62a which are provided in this way between the two semiconductor elements 20, the current paths on which the control current 90a flows into and out of the two semiconductor elements 20 are equalized in length. This makes it possible to improve the controllability of operations of the semiconductor elements 20.

In the semiconductor device 10, the positive electrode terminal 34 and the negative electrode terminal 44 are respectively provided on the substrate 30 and the substrate 40 on both main surface sides of the semiconductor elements 20, and the semiconductor device 10 has a terminal arrangement where the negative electrode terminal 44 is positioned between the end portion 81a of the control terminal 81 and the end portion 82a of the control terminal 82 and the positive electrode terminal 34.

Figure 10:
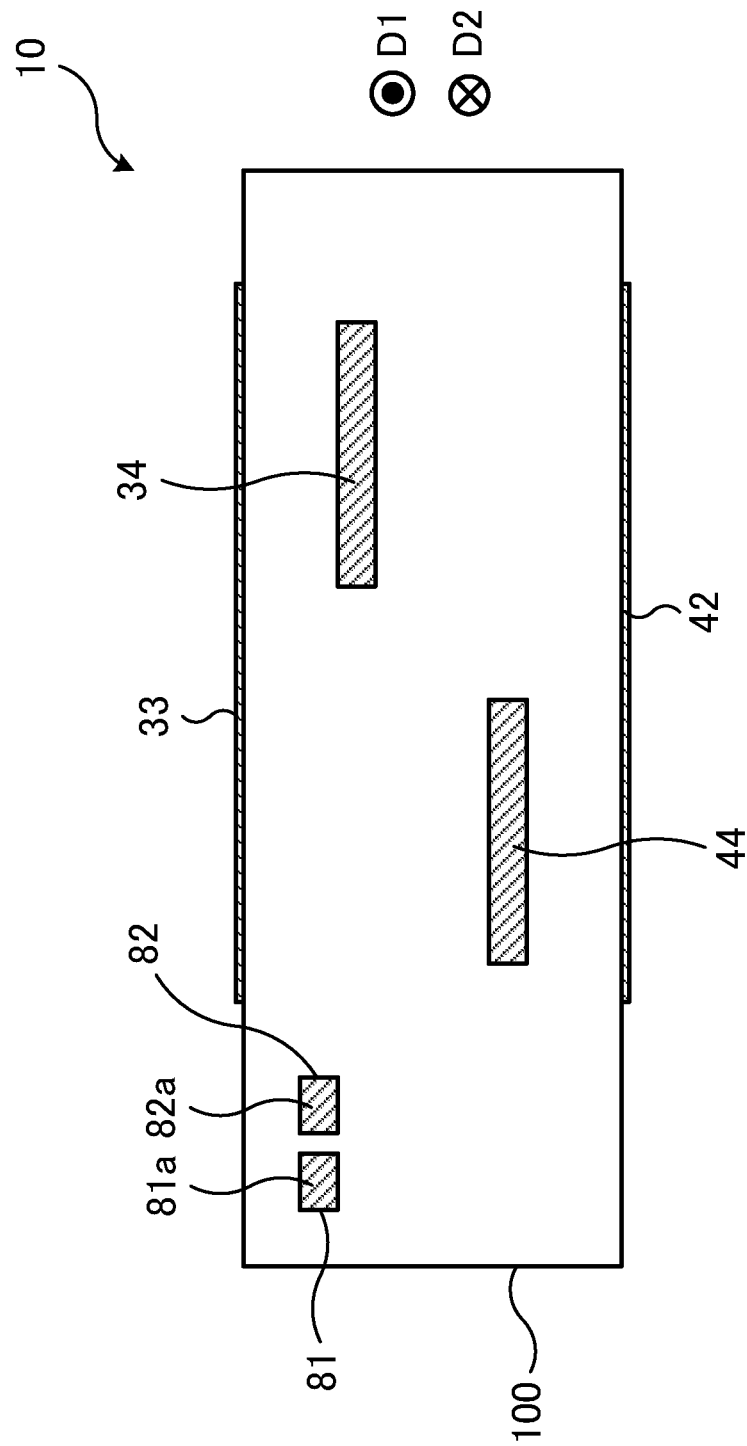
FIG. 10 depicts an example terminal arrangement of the semiconductor device according to the second embodiment.

FIG. 10 depicts one example of a terminal arrangement of a semiconductor device according to the second embodiment. FIG. 10 is a schematic plan view of a principal part of an example of a semiconductor device when looking from the terminal side.

In the semiconductor device 10, as depicted in FIG. 10, the positive electrode terminal 34, the negative electrode terminal 44, and the end portions 81a and 82a of the control terminal 81 and the control terminal 82 are disposed so as to be aligned in that order. As described above, in the semiconductor device 10, the positive electrode terminal 34 is provided on one substrate 30 that sandwiches the semiconductor elements 20, the negative electrode terminal 44 is provided on the other substrate 40, and the control terminal 81 and the control terminal 82 are provided in the same layer as the substrate 30. This means that the positive electrode terminal 34, the negative electrode terminal 44, and the end portions 81a and 82a of the control terminal 81 and the control terminal 82 are disposed, when looking from the terminal side, in a staggered arrangement as depicted in FIG. 10. By using this staggered arrangement, compared to a configuration where the positive electrode terminal 34, the negative electrode terminal 44, and the end portions 81a and 82a of the control terminal 81 and the control terminal 82 are arranged in a line in the left-right direction in FIG. 10, an increase in the size of the semiconductor device 10 in the left-right direction in FIG. 10 is suppressed, and it is possible to provide sufficient insulation distance between the positive electrode terminal 34 and the negative electrode terminal 44 and sufficient insulation distance between the negative electrode terminal 44 and the control terminal 81 and control terminal 82. This means that the semiconductor device 10 may be miniaturized.

By using the staggered arrangement as depicted in FIG. 10, in addition to miniaturizing the semiconductor device 10 itself, it is also possible to miniaturize a semiconductor device (electronic device) produced by connecting a plurality of the semiconductor devices 10.

Figure 11A:
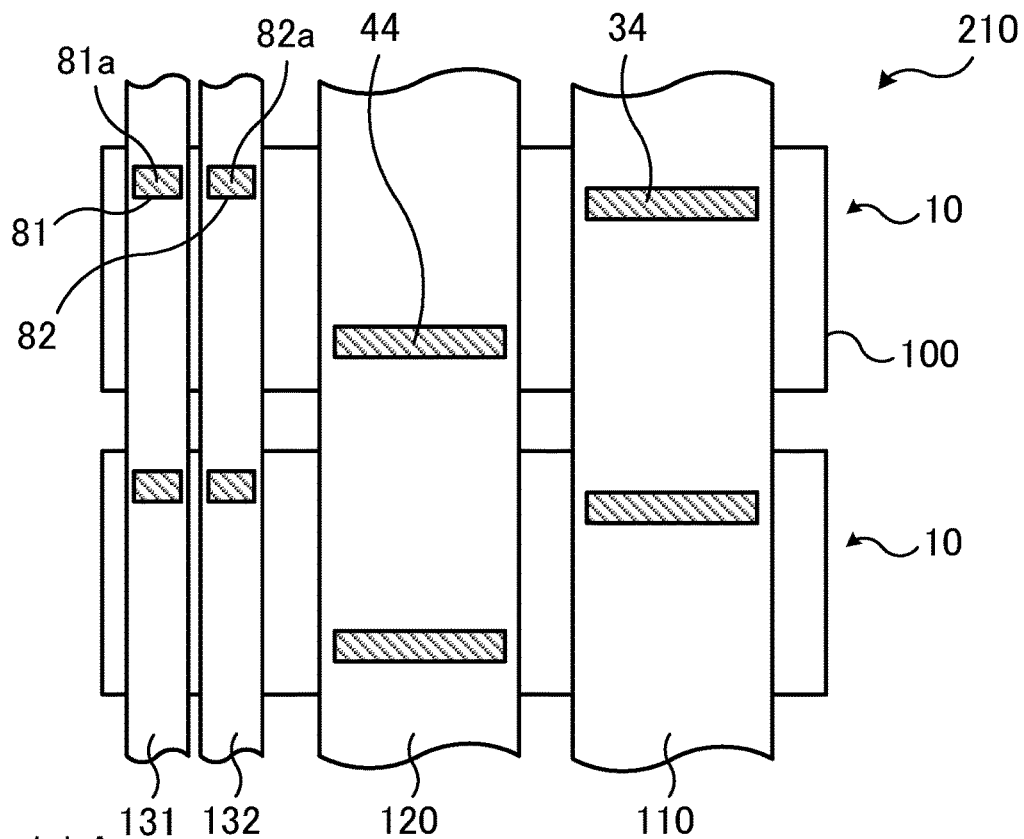
FIGS. 11A and 11B depict first example connections of a semiconductor device according to the second embodiment.
Figure 11B:
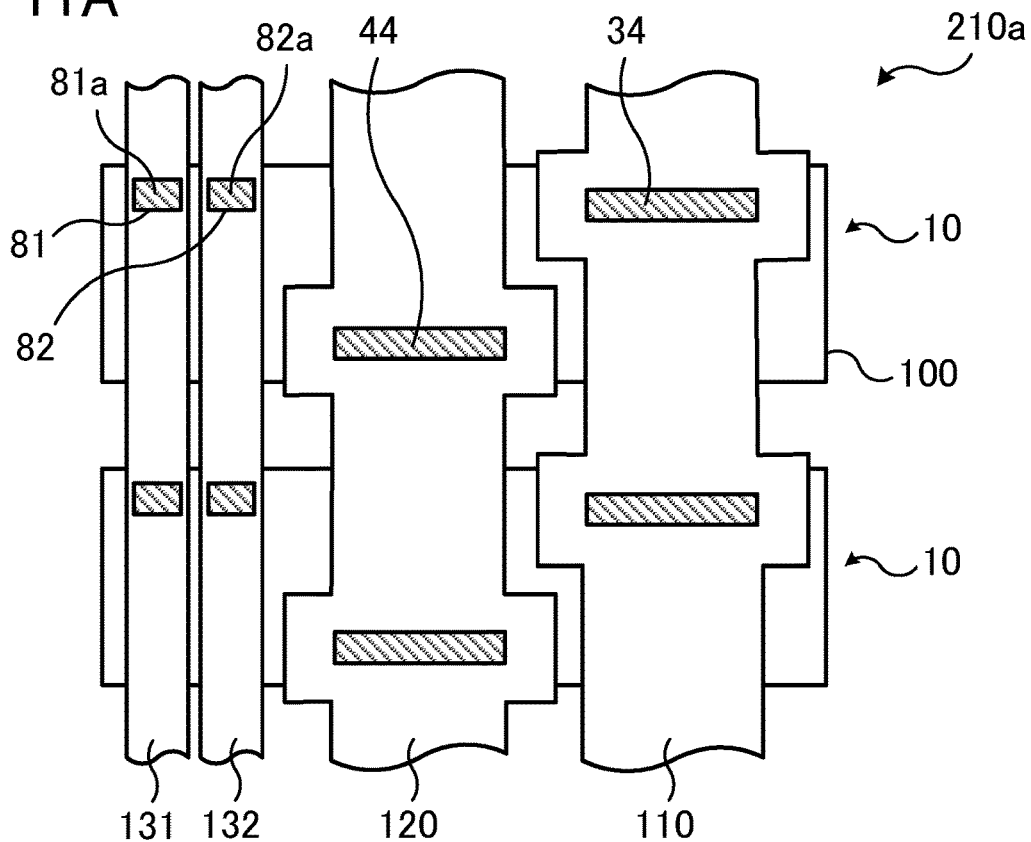
Figure 12:
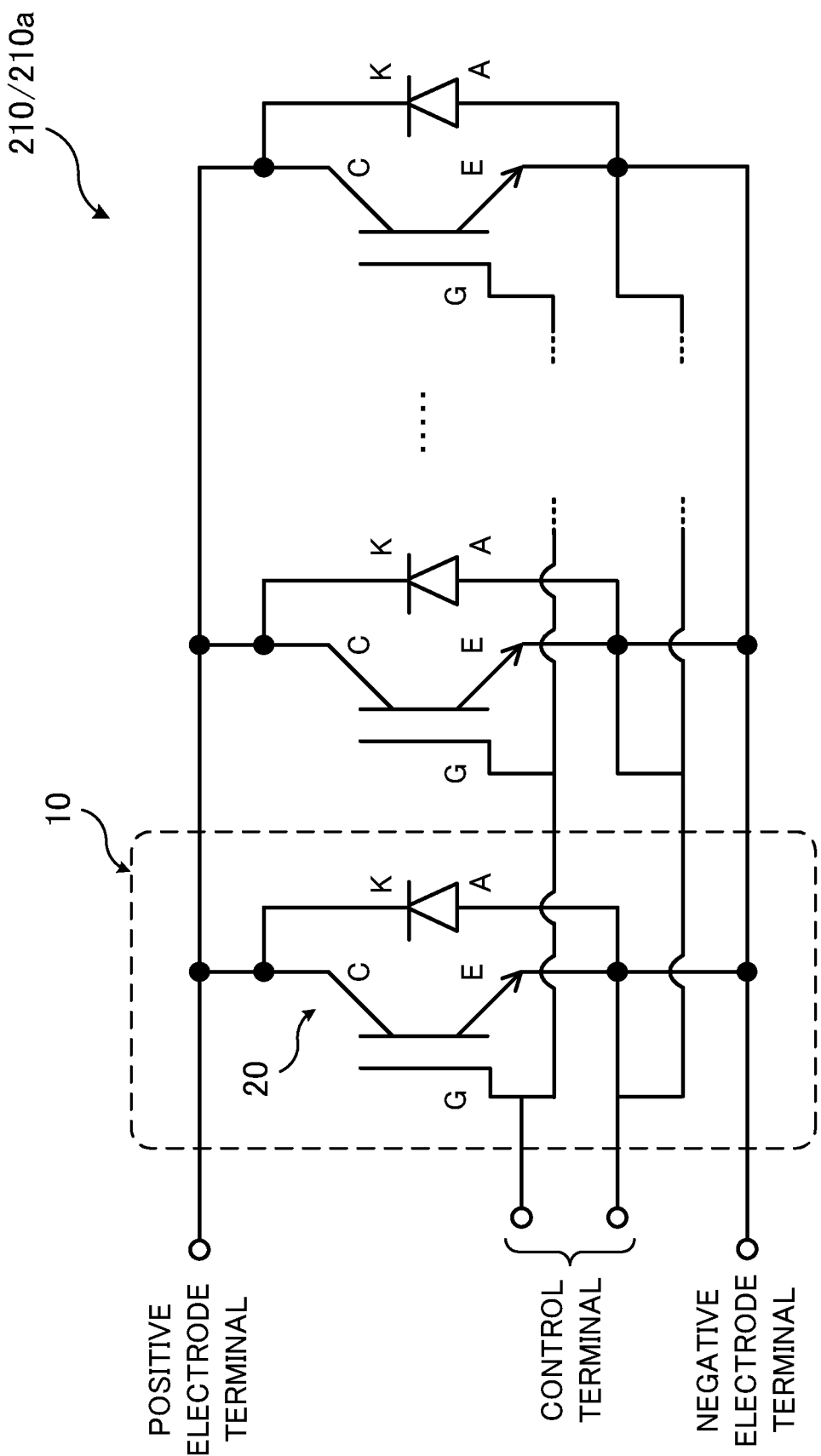
FIG. 12 depicts the first example connections of a semiconductor device according to the second embodiment.

FIGS. 11A, 11B, and 12 depict first example connections of a semiconductor device according to the second embodiment. FIGS. 11A and 11B are schematic plan views depicting a principal part of an example group of semiconductor devices that are connected in parallel when looking from the terminal side. FIG. 12 is an equivalent circuit diagram of a group of semiconductor devices that are connected in parallel.

As one example, as depicted in FIG. 11A, a plurality of semiconductor devices 10 (semiconductor modules) are disposed side by side with the same orientation. The positive electrode terminals 34 are interconnected by wiring 110, such as a bus bar, and the negative electrode terminals 44 are similarly interconnected by wiring 120, such as a bus bar. The end portions 81a of the control terminals 81 are interconnected by wiring 131, such as a bus bar, and the end portions 82a of the control terminals 82 are interconnected by wiring 132, such as a bus bar. By doing so, a semiconductor device 210 (electronic device) in which a plurality of semiconductor devices 10 are connected in parallel with a circuit configuration like that depicted in FIG. 12 is realized. Note that for convenience, the circuit configuration of the plurality of (in this example, two) semiconductor elements 20 included in one semiconductor device 10 and connected in parallel is depicted in FIG. 12 as one pair of a transistor and a diode (in this example, an RC-IGBT).

When the positive electrode terminals 34 and the negative electrode terminals 44 are disposed in a staggered arrangement including the end portions 81a and the end portions 82a, as depicted in FIG. 11B, it is also possible to realize a semiconductor device 210a (electronic device) where the width of connecting parts for connecting the wiring 110, such as a busbar, to the plurality of positive electrode terminals 34 and the width of the connecting parts for connecting the wiring 120, such as a busbar, to the plurality of negative electrode terminals 44 are set wider that the widths of the other parts of the wiring. With this semiconductor device 210a, connecting the wiring 110 and the plurality of positive electrode terminals 34 and connecting the wiring 120 and the plurality of negative electrode terminals 44 are facilitated, the voltage applied to the plurality of positive electrode terminals 34 and the voltage applied to the plurality of negative electrode terminals 44 are made uniform, and parts aside from the connecting parts between the wiring 110 and the plurality of positive electrode terminals 34 and the connecting parts between the wiring 120 and the plurality of negative electrode terminals 44 are narrowed, and the resulting reduction in material makes it possible to reduce the cost of the semiconductor device 210a.

As described above, the semiconductor device 10 may be arranged so that a plurality of semiconductor devices 10 are stacked with the same orientation, and it is possible to connect the positive electrode terminals 34, the negative electrode terminals 44, the control terminals 81, and the control terminals 82 using the wiring 110, the wiring 120, the wiring 131, and the wiring 132 respectively that are linear and extend in parallel. As a result, a compact semiconductor device 210 including a plurality of semiconductor devices 10 that are connected in parallel is realized.

Although an example where a plurality of semiconductor devices 10 are connected in parallel has been described above, it is obvious that a plurality of semiconductor devices 10 may also be connected in series.

Figure 13:
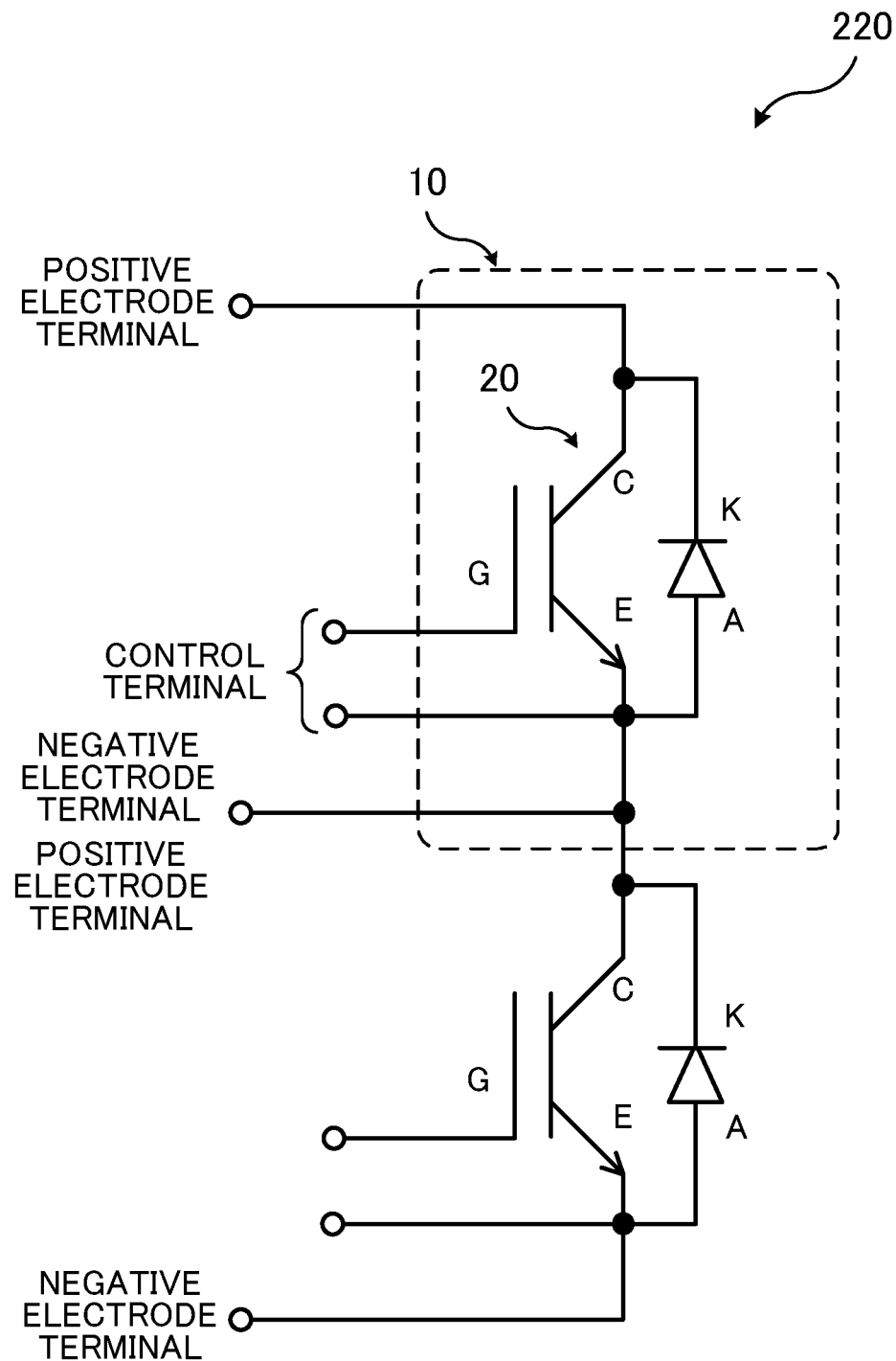
FIG. 13 depicts second example connections of a semiconductor device according to the second embodiment.

FIG. 13 depicts second example connections of a semiconductor device according to the second embodiment. FIG. 13 is an equivalent circuit diagram of a group of semiconductor devices that are connected in series.

As one example, as depicted in FIG. 13, a semiconductor device 220 (electronic device) where a plurality of (in this example, two) semiconductor devices 10 are connected in series with their negative electrode terminals 44 and positive electrode terminals 34 electrically connected to each other is realized. Note that for convenience, the circuit configuration of a plurality of (in this example, two) semiconductor elements 20 included in one semiconductor device 10 and connected in parallel is depicted in FIG. 13 as a pair of a transistor and a diode (in this example, an RC-IGBT). Here, a plurality of compact semiconductor devices 10 are connected in series to realize a compact semiconductor device 220.

Although an example where two semiconductor elements 20 are mounted in one semiconductor device 10 is given in the above description, the number of semiconductor elements 20 mounted in one semiconductor device 10 is not limited to two.

Figure 14A:
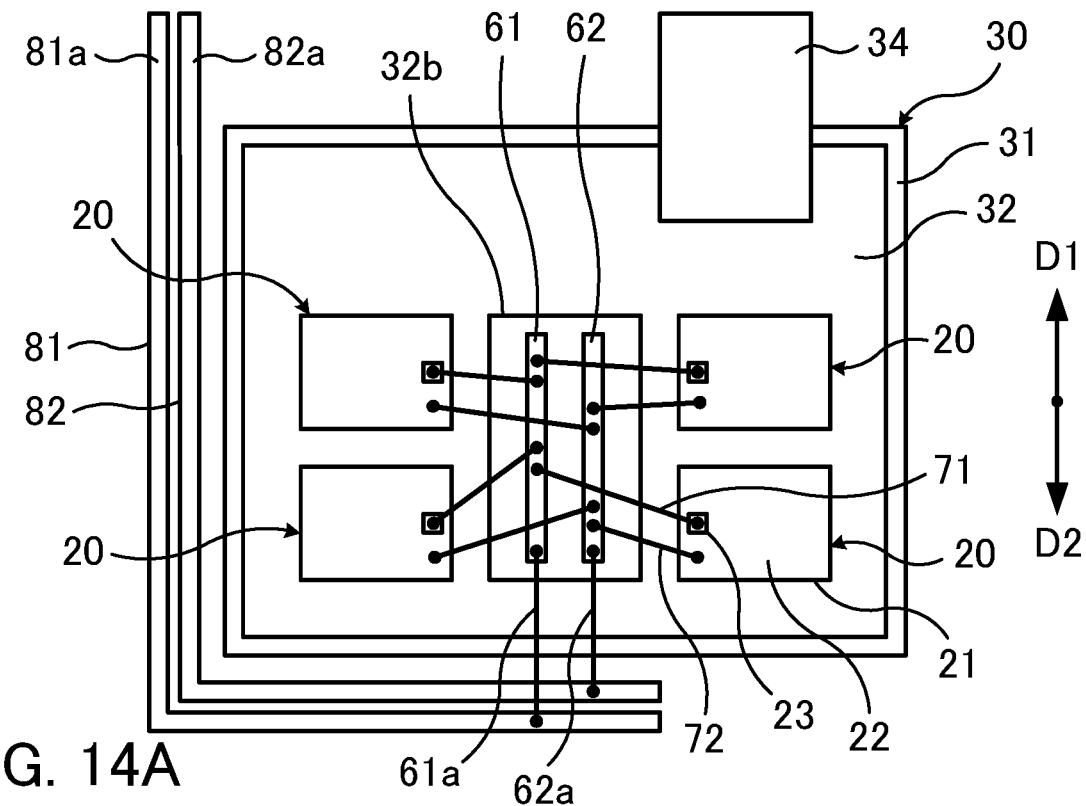
FIGS. 14A and 14B depict example modifications of a semiconductor device according to the second embodiment.
Figure 14B:
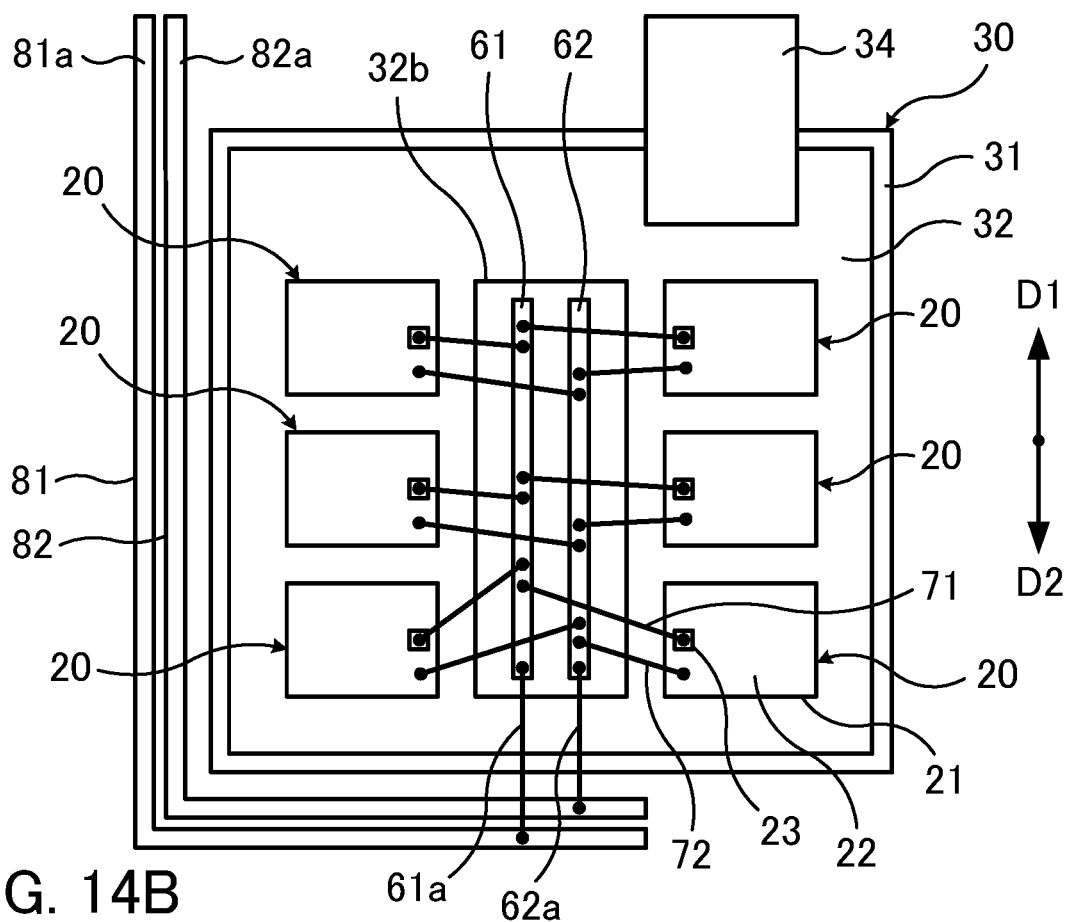

FIGS. 14A and 14B depict example modifications of a semiconductor device according to the second embodiment. FIGS. 14A and 14B are both schematic plan views of principal parts of semiconductor devices that are example modifications.

Note that for convenience, the substrate 40 on which the negative electrode terminal 44 is provided and the resin 100 have been omitted from FIGS. 14A and 14B.

As one example, as depicted in FIG. 14A, the semiconductor device 10 may be provided with four semiconductor elements 20. As the four semiconductor elements 20, the same type of semiconductor elements 20 may be used, or different types of semiconductor elements 20 may be used. As one example, RC-IGBT are used as the four semiconductor elements 20. With this configuration, the collector electrodes 21 of the four semiconductor elements 20 are connected to the conductor layer 32 of the substrate 30 provided with the positive electrode terminal 34, and the emitter electrodes 22 of the four semiconductor elements 20 are connected to the conductor layer 43 of the substrate 40 provided with the negative electrode terminal 44 (not illustrated). The gate electrodes 23 of the four semiconductor elements 20 are connected to the land 61 using the wires 71, and the land 61 is connected to the control terminal 81 using the wire 61a. The emitter electrodes 22 of the four semiconductor elements 20 are connected to the land 62 using the wires 72, and the land 62 is connected to the control terminal 82 using the wire 62a. As a result, the semiconductor device 10 in which the four semiconductor elements 20 that are RC-IGBT are connected in parallel is realized.

As another example, as depicted in FIG. 14B, the semiconductor device 10 may be provided with six semiconductor elements 20. The same type of semiconductor elements 20 may be used as the six semiconductor elements 20, or different types of semiconductor elements 20 may be used. As one example, RC-IGBT are used as the six semiconductor elements 20. With this configuration, the collector electrodes 21 of the six semiconductor elements 20 are connected to the conductor layer 32 of the substrate 30 provided with the positive electrode terminal 34, and the emitter electrodes 22 of the six semiconductor elements 20 are connected to the conductor layer 43 of the substrate 40 provided with the negative electrode terminal 44 (not depicted). The gate electrodes 23 of the six semiconductor elements 20 are connected to the land 61 using the wires 71, and the land 61 is connected to the control terminal 81 using the wire 61a. The emitter electrodes 22 of the six semiconductor elements 20 are connected to the land 62 using the wires 72, and the land 62 is connected to the control terminal 82 using the wire 62a. As a result, a semiconductor device 10 where six semiconductor elements 20 that are RC-IGBT are connected in parallel is realized.

The same effects as described above may also be obtained by the configurations depicted in FIGS. 14A and 14B.

Note that it is also possible to produce a semiconductor device 10 in which an even number of eight or more semiconductor elements 20 are mounted. It is also possible to produce a semiconductor device 10 in which an odd number of three or more semiconductor elements 20 are mounted.

Third Embodiment

Figure 15:
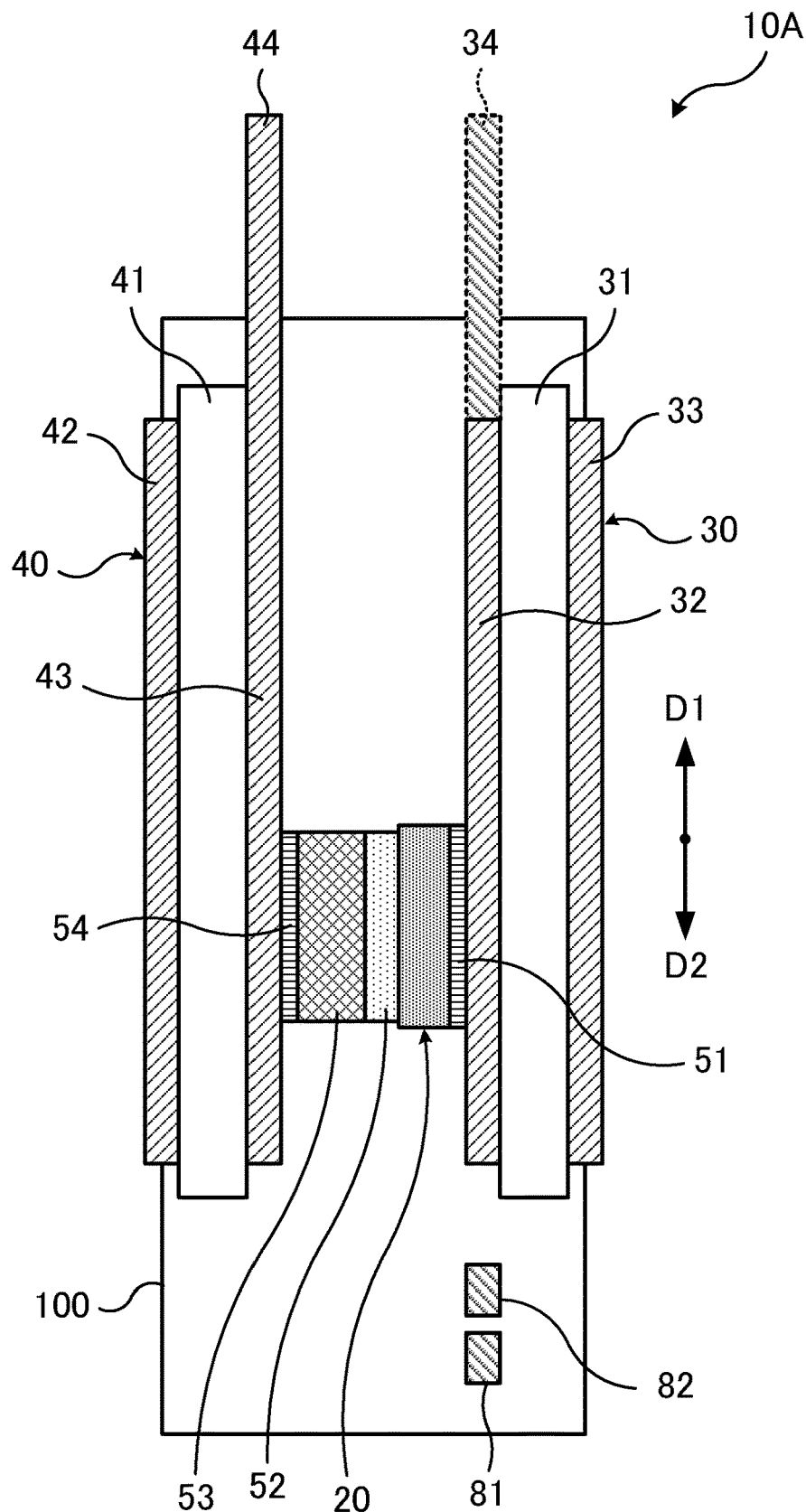
FIG. 15 depicts one example of a semiconductor device according to a third embodiment.

FIG. 15 depicts one example of a semiconductor device according to a third embodiment. FIG. 15 is a cross-sectional view schematic depicting a principal part of one example of a semiconductor device.

The semiconductor device 10A depicted in FIG. 15 differs to the semiconductor device 10 according to the second embodiment described above in that the positive electrode terminal 34 is integrated with the conductor layer 32 (that is, formed as part of the conductor layer 32) and the negative electrode terminal 44 is integrated with the conductor layer 43 (that is, formed as part of the conductor layer 43). For convenience, the positive electrode terminal 34 is schematically depicted in FIG. 15 using dotted lines.

As one example, the substrate 30 where the positive electrode terminal 34 is integrated with the conductor layer 32 may be produced by bonding the conductor layer 32, which has been integrated with the positive electrode terminal 34, to the insulating board 31. Likewise, the substrate 40 where the negative electrode terminal 44 is integrated with the conductor layer 43 may be produced for example by bonding the conductor layer 43, which has been integrated with the negative electrode terminal 44, to the insulating board 41.

As one example, as the conductor layer 32 that has been integrated with the positive electrode terminal 34 and the conductor layer 43 that has been integrated with the negative electrode terminal 44, it is possible to use conductor plates that have parts including mounting regions for the semiconductor elements 20 and from which parts corresponding to the positive electrode terminal 34 and the negative electrode terminal 44 extend. As the conductor layer 32 that has been integrated with the positive electrode terminal 34 and the conductor layer 43 that has been integrated with the negative electrode terminal 44, it is also possible to use a lead frame that has die pads in the mounting regions of the semiconductor elements 20 and has leads corresponding to the positive electrode terminal 34 and the negative electrode terminal 44 extending from the die pads.

The semiconductor device 10A with the configuration depicted in FIG. 15 is also able to achieve the same effects as the semiconductor device 10 according to the second embodiment described above.

Note that a plurality of the semiconductor devices 10A described in the third embodiment may be connected in parallel or in series in the same way as the examples described for the second embodiment (see FIGS. 11 to 13).

Fourth Embodiment

Figure 16A:
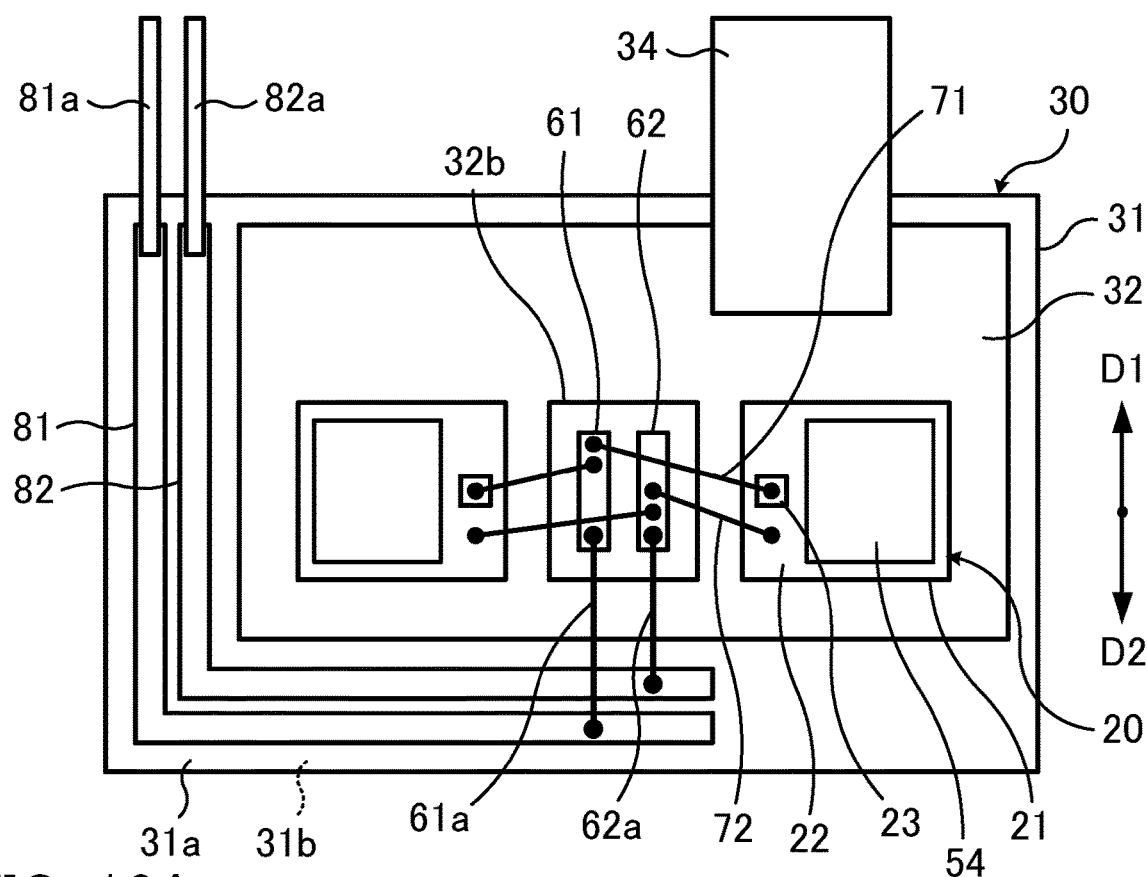
FIGS. 16A and 16B depict one example of a semiconductor device according to a fourth embodiment.
Figure 16B:
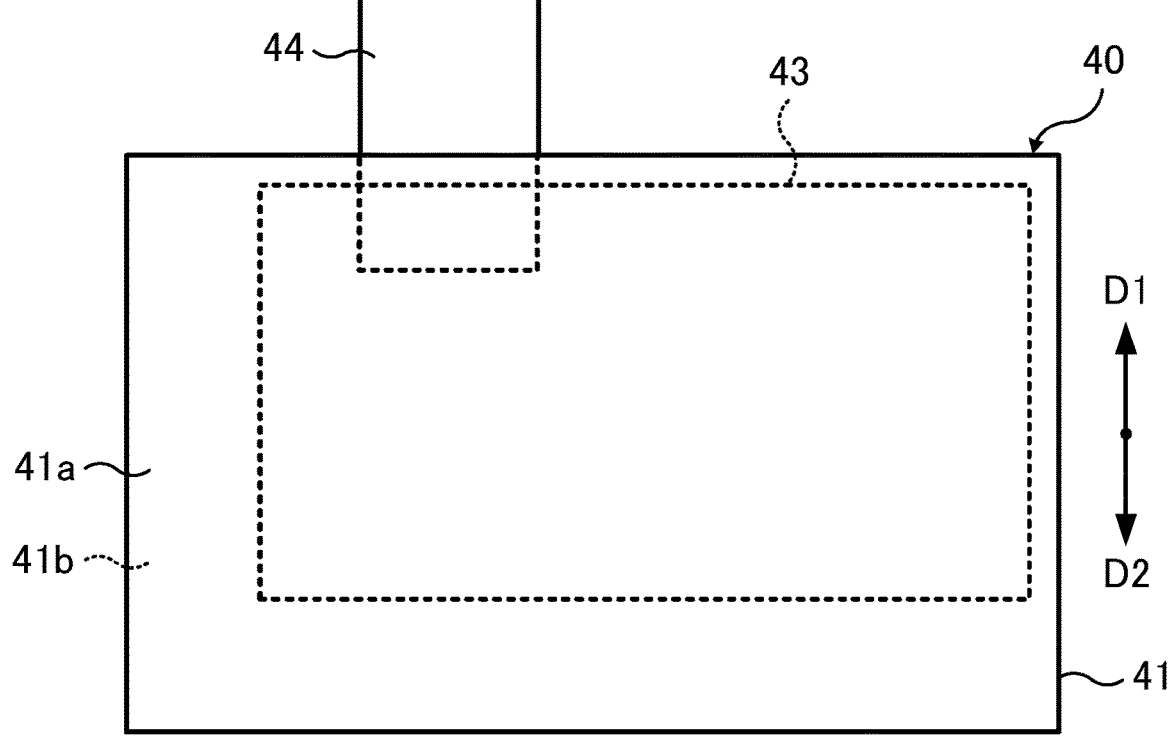

FIGS. 16A and 16B depict one example of a semiconductor device according to a fourth embodiment. FIGS. 16A and 16B are exploded plan views schematically depicting principal parts of one example of a semiconductor device.

FIG. 16A is a schematic plan view of a principal part of the substrate 30, which faces the substrate 40 depicted in FIG. 16B with the semiconductor elements 20 in between, when looking from the semiconductor element 20 side. FIG. 16B is a schematic plan view of a principal part of the substrate 40, which faces the substrate 30 depicted in FIG. 16A with the semiconductor elements 20 in between, when looking from an opposite side to the semiconductor element 20 side. As one example, RC-IGBT are used as the two semiconductor elements 20.

As depicted in FIG. 16A, the collector electrodes 21 of the two semiconductor elements 20 that are RC-IGBT are connected to the conductor layer 32 provided on one main surface 31a of the insulating board 31 of the substrate 30, and the gate electrodes 23 and the emitter electrodes 22 are respectively connected to the land 61 and the land 62 using the wires 71 and the wires 72. The land 61 and the land 62 are respectively connected to the control terminal 81 and the control terminal 82 using the wire 61a and the wire 62a. The emitter electrodes 22 of the two semiconductor elements 20 are connected to the conductor layer 43 provided on the main surface 41b of the insulating board 41 of the substrate 40 depicted in FIG. 16B via the bonding material 52 and the like.

Note that for convenience, the conductor layer 33 provided on the other main surface 31b of the insulating board 31 of the substrate 30, the conductor layer 42 provided on the other main surface 41a of the insulating board 41 of the substrate 40, and the resin 100 that seals the semiconductor elements 20 and the like have been omitted from FIGS. 16A and 16B.

In this fourth embodiment, the control terminal 81 and the control terminal 82 that are electrically connected to the gate electrodes 23 and the emitter electrodes 22 of the semiconductor elements 20 are provided on the main surface 31a of the insulating board 31 that is provided with the conductor layer 32 as well as the land 61 and the land 62. That is, the control terminal 81 and the control terminal 82 are provided in the same layer as the conductor layer 32 and the land 61 and the land 62 on the main surface 31a of the insulating board 31. The control terminal 81 and the control terminal 82 are provided on the main surface 31a of the insulating board 31 along the outer edges of the conductor layer 32 and the conductor layer 43 so as to be positioned outside the conductor layer 32 and the conductor layer 43 provided so as to face the conductor layer 32. As one example, the control terminal 81 and the control terminal 82 provided on the main surface 31a of the insulating board 31 are provided with end portions 81a and 82a so as to protrude on the same side as the positive electrode terminal 34 and the negative electrode terminal 44. As examples, the end portion 81a and the end portion 82a are electrically and mechanically connected to the control terminal 81 and the control terminal 82 by solder or a sintered material like copper or silver, or by ultrasonic bonding.

As one example, the conductor layer 32, the lands 61 and 62, and also the control terminals 81 and 82 may be produced by patterning a conductor layer provided on the main surface 31a of the insulating board 31 by etching or the like. Alternatively, the conductor layer 32, the lands 61 and 62, and the control terminals 81 and 82 may be obtained by bonding to the main surface 31a of the insulating board 31.

As described in this fourth embodiment, so long as the control terminal 81 and the control terminal 82 are positioned outside the conductor layer 32 and the conductor layer 43, the control terminal 81 and the control terminal 82 may be provided on the main surface 31a of the insulating board 31 together with the conductor layer 32 and the land 61 and the land 62. A semiconductor device that has the substrate 30 as depicted in FIG. 16A and the substrate 40 as depicted in FIG. 16B may also achieve the same effects as the semiconductor device 10 according to the second embodiment described above.

Note that in the fourth embodiment, the positive electrode terminal 34 and the negative electrode terminal 44 may be integrated with the conductor layer 32 of the substrate 30 and the conductor layer 43 of the substrate 40 respectively (that is, respectively formed as part of the conductor layer 32 and as part of the conductor layer 43) in the same way as the example described in the third embodiment.

Also in this fourth embodiment, the end portion 81a of the control terminal 81 and the end portion 82a of the control terminal 82 may be integrated with the control terminal 81 and the control terminal 82 respectively (that is, respectively formed as part of the control terminal 81 and as part of the control terminal 82).

It is also possible to connect a plurality of semiconductor devices according to the fourth embodiment in series or in parallel in the same way as the examples described for the second embodiment (see FIGS. 11 to 13).

Fifth Embodiment

Figure 18A:
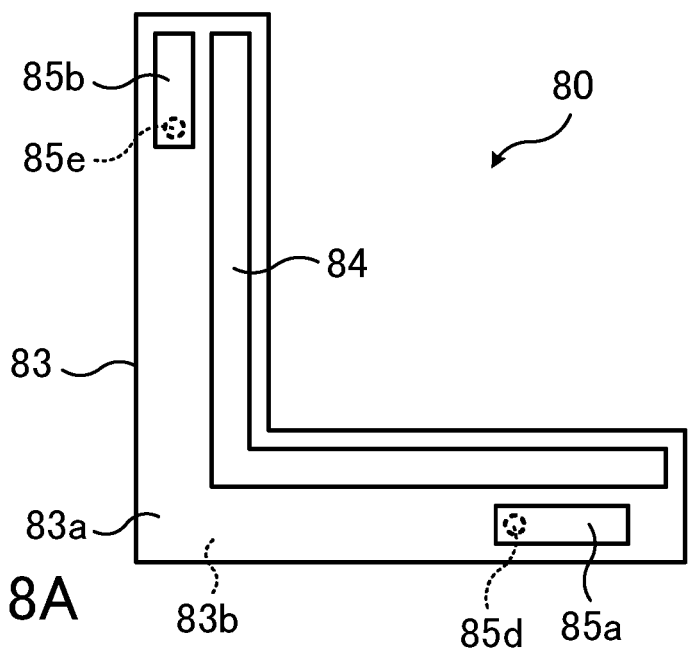
FIGS. 18A to 18C depict one example of a control terminal of a semiconductor device according to the fifth embodiment.
Figure 18B:
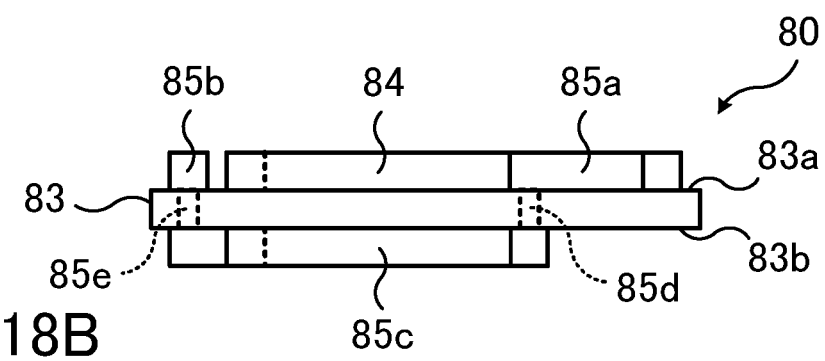
Figure 18C:
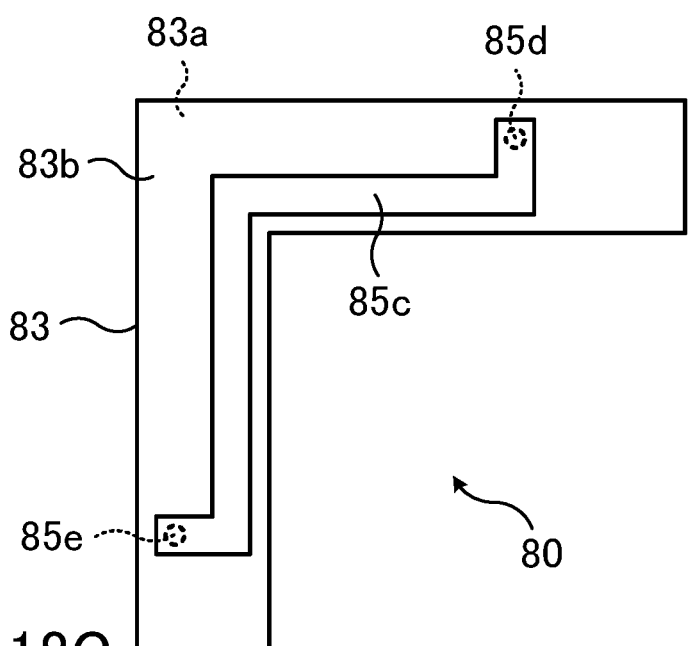

FIG. 17 depicts one example of a semiconductor device according to a fifth embodiment. FIG. 17 is a schematic plan view of a principal part of one example of a semiconductor device. FIGS. 18A to 18C depict one example of a control terminal of the semiconductor device according to the fifth embodiment. FIG. 18A is a schematic plan view of a principal part of one example of a control terminal, FIG. 18B is a schematic side view of a principal part of one example of a control terminal, and FIG. 18C is a schematic bottom view of a principal part of one example of a control terminal.

The semiconductor device 10B depicted in FIG. 17 differs to the semiconductor device 10 described above in the second embodiment (see FIG. 5 and the like) in being provided with a control terminal 80 that has a laminated wiring structure. Note that for convenience, the conductor layer 33 of the substrate 30 and the conductor layers 42 and 43 of the substrate 40 have been omitted from FIG. 17.

As one example, as depicted in FIGS. 18A to 18C, the control terminal 80 with a laminated wiring structure includes an insulating layer 83, wiring 84 that is provided on a first main surface 83a of the insulating layer 83 and is L-shaped in two dimensions, and wiring 85a and wiring 85b that are disposed in parallel at a first end portion and a second end portion respectively of the wiring 84. The control terminal 80 further includes wiring 85c that is provided on a second main surface 83b of the insulating layer 83 and is L-shaped in two dimensions (an inverted L-shape when viewed from the bottom surface side) between the two end portions. The wiring 85a provided on the first main surface 83a of the insulating layer 83 is connected to the first end portion of the wiring 85c provided on the second main surface 83b of the insulating layer 83 by a through hole 85d. The wiring 85b provided on the first main surface 83a of the insulating layer 83 is connected to the second end portion of the wiring 85c provided on the second main surface 83b of the insulating layer 83 by a through hole 85e. The wiring 84 provided on the first main surface 83a of the insulating layer 83 and the wiring 85c provided on the second main surface 83b of the insulating layer 83 extend so that the parts that are L-shaped in two dimensions between the first end portion and the second end portion overlap.

As the insulating layer 83, various insulating materials are used. As examples, as the insulating layer 83, an inorganic insulating material such as aluminum oxide, aluminum nitride, silicon nitride, or silicon oxide, or an organic insulating material such as epoxy resin, phenol resin, or polyimide resin is used. The organic insulating material may contain an insulating filler, fiber such as glass, and/or cloth.

Various conductor materials are used as the wiring 84, the wiring 85a, the wiring 85b, the wiring 85c, the through hole 85d, and the through hole 85e. As one example, a conductor material such as copper or copper alloy is used for the wiring 84, the wiring 85a, the wiring 85b, the wiring 85c, the through hole 85d, and the through hole 85e. The wiring 84, the wiring 85a, the wiring 85b, the wiring 85c, the through hole 85d, and the through hole 85e may be provided with a surface treatment layer of nickel, gold or the like. For the through holes 85d and 85e, a structure where a conductor material is provided on the inner wall of a through hole that passes through the insulating layer 83 (a so-called "conformal via") may be used, or a structure where conductor material is used to fill the inside of a through hole (a so-called "filled via") may be used.

In the control terminal 80 with this configuration, as one example, the wiring 85a provided on the first main surface 83a of the insulating layer 83, the through hole 85d, the wiring 85c provided on the second main surface 83b of the insulating layer 83, the through hole 85e, and the wiring 85b provided on the first main surface 83a of the insulating layer 83 have a function that corresponds to the control terminal 81 described in the second embodiment. Also, in the control terminal 80, as one example, the wiring 84 provided on the first main surface 83a of the insulating layer 83 has a function corresponding to the control terminal 82 described in the second embodiment.

In the semiconductor device 10B, the respective widths and thicknesses of the wiring 84, the wiring 85a, the wiring 85b, and the wiring 85c, the diameters of the through hole 85d and the through hole 85e, and the thickness of the conductor portions from the inner walls of the through holes are set for example based on the current flowing through these elements. The interval between the wiring 84 and the wiring 85a, 85b and 85c and the intervals between the wiring 84 and wiring 85c and the conductor layers 32 and 43 are set for example based on the voltages applied to these elements and insulation distances that depend on these applied voltages.

In the semiconductor device 10B, as depicted in FIG. 17, the land 61, which is connected to the gate electrodes 23 of the two semiconductor elements 20 using the wires 71, and the wiring 85a at the first end portion side of the control terminal 80 are connected by the wire 61a. The land 62, which is connected to the emitter electrodes 22 of the two semiconductor elements 20 using the wires 72, and the wiring 84 on the first end portion side of the control terminal 80 are connected by the wire 62a.

In the semiconductor device 10B, the substrate 30 and the substrate 40, the semiconductor elements 20 and the like provided between the substrates 30 and 40, and the control terminal 80 are sealed with the resin 100 so as to expose the positive electrode terminal 34, the negative electrode terminal 44, and the wiring 85b and the wiring 84 on the second end side of the control terminal 80 (and the conductor layer 33 and the conductor layer 42 that have been omitted from FIG. 17).

When the semiconductor device 10B operates, a predetermined voltage is applied between the wiring 85b and the wiring 84 of the control terminal 80 exposed from the resin 100.

When the semiconductor elements 20 are switched from off to on, an on voltage is applied and a predetermined current for charging the gates of the gate electrodes 23 of the two semiconductor elements 20 flows from the wiring 85b of the control terminal 80 through the through hole 85e, the wiring 85c, the through hole 85d and the wiring 85a, and also through the wire 61a, the land 61, and the wires 71. A predetermined current flows out from the emitter electrodes 22 of the two semiconductor elements 20 through the wires 72, the land 62, and the wire 62a to the wiring 84 of the control terminal 80. That is, a control current flows from the wiring 85b of the control terminal 80 into the semiconductor elements 20 and out of the semiconductor elements 20 into the wiring 84 of the control terminal 80.

Conversely, when switching from on to off, an off voltage that is lower than the on voltage is applied so that a current for discharging the gates flows from the semiconductor elements 20 to the wiring 85b of the control terminal 80 and a current flows from the wiring 84 of the control terminal 80 into the semiconductor elements 20.

Note that the wire 61a and the land 61 are an example form of gate wiring that is electrically connected to the gate electrode 23, and the land 62 and the wire 62a are an example form of sensing wiring that is electrically connected to the emitter electrode 22 that functions as a sensing electrode. The wiring 85b, the through hole 85e, the wiring 85c, the through hole 85d, and the wiring 85a are an example form of a gate terminal line that is electrically connected to the gate wiring, and the wiring 84 is an example form of a sensing terminal line that is electrically connected to the sensing wiring.

When the semiconductor device 10B is operating, a predetermined voltage is also applied between the positive electrode terminal 34 connected to the collector electrodes 21 of the two semiconductor elements 20 and the negative electrode terminals 44 connected to the emitter electrodes 22. When the semiconductor elements 20 are on, the main current flows in from the positive electrode terminal 34 and flows out via the two semiconductor elements 20 to the negative electrode terminal 44. When the semiconductor elements 20 are off, the main current is stopped.

With the semiconductor device 10B, on the control terminal 80 through which the control current flows, out of the current path where current flows in from the wiring 85b to reach the wiring 85a, the direction of the current that flows through the wiring 85c and the direction of the current that flows out from the semiconductor elements 20 and flows through the wiring 84 are opposite directions. Here, the wiring 85c and the wiring 84 extend so that the parts that are L-shaped in two dimensions between the first end portion and the second end portion overlap each other. By using this configuration, in the semiconductor device 10B, the electromagnetic field generated by the current flowing through the wiring 85c and the electromagnetic field generated by the current flowing through the wiring 84 will cancel each other out.

Figure 19A:
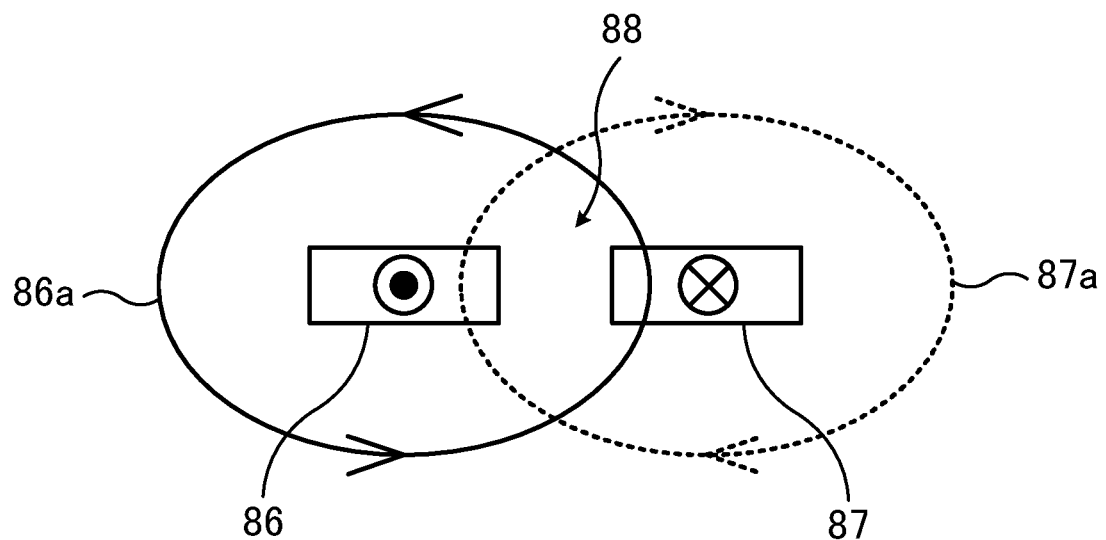
FIGS. 19A and 19B depict a relationship between currents that flow in wiring and electromagnetic fields.
Figure 19B:
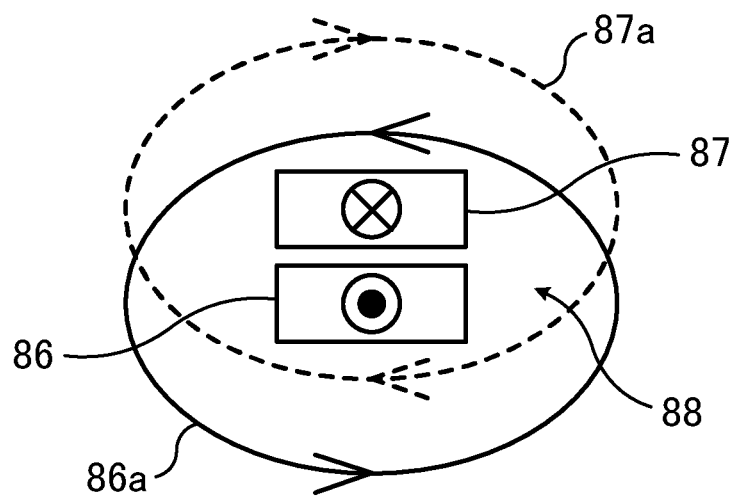

FIGS. 19A and 19B depict the relationship between the currents flowing in the wiring and the electromagnetic fields. FIG. 19A is a cross-sectional view schematically depicting a principal part of one example of two wires disposed in parallel in the horizontal direction, and also depicts the currents flowing through the two wires and the electromagnetic fields generated by the currents. FIG. 19B is a cross-sectional view schematically depicting a principal part of one example of two wires disposed in parallel in the vertical direction, and also depicts the currents flowing through the two wires and the electromagnetic fields generated by the currents.

As one example, as depicted in FIG. 19A, when electric currents in opposing directions flow through the wires 86 and 87 that are disposed in parallel in the horizontal direction, a counterclockwise electromagnetic field 86a is generated by one wire and a clockwise electromagnetic field 87a is generated by the other wire. At an intersecting portion 88 of the electromagnetic field 86a and the electromagnetic field 87a, the electromagnetic field 86a and the electromagnetic field 87a cancel each other out. As depicted in FIG. 19B, when electric currents in opposing directions flow through the two wires 86 and 87 disposed in parallel in the vertical direction, in the same way, a counterclockwise electromagnetic field 86a is generated by one wire and a clockwise electromagnetic field 87a is generated by the other wire. At the intersecting portion 88 of the electromagnetic field 86a and the electromagnetic field 87a, the electromagnetic field 86a and the electromagnetic field 87a cancel each other out.

In a structure where two wires 86 and 87 are disposed in parallel in the vertical direction (see FIG. 19B), compared to a structure where the two wires 86 and 87 are disposed in parallel in the horizontal direction (see FIG. 19A), it is possible to increase the intersecting portion 88 of the electromagnetic field 86a and the electromagnetic field 87a generated by the currents flowing in opposing directions in the wires. This means that the canceling out effect of the electromagnetic field 86a and the electromagnetic field 87a may be increased. Note that even when the vertical interval between the wires 86 and 87 that are disposed in parallel in the vertical direction and the horizontal interval between the wires 86 and 87 that are disposed in parallel in the horizontal direction are the same, with the structure where the wire 86 and the wire 87 are disposed in parallel in the vertical direction, a relatively large cancelling out effect for the electromagnetic field 86a and the electromagnetic field 87a may be obtained.

As depicted in FIGS. 17 and 18A to 18C, a structure where the wiring 85c and the wiring 84 through which current flows in opposing directions are disposed in parallel in the vertical direction, or in other words, a "laminated wiring structure" is used for the control terminal 80 used in the semiconductor device 10B described above. As a result, it is possible to make the intersecting part of the electromagnetic fields generated by the currents flowing in opposing directions in the wiring 85c and the wiring 84 relatively large, and thereby cause the electromagnetic fields to effectively cancel each other out. By adjusting the material and the thickness of the insulating layer 83 interposed between the wiring 85c and the wiring 84, it is possible to have the respective electromagnetic fields generated by the currents flowing in opposing directions in the wiring 85c and the wiring 84 more effectively cancel each other out. In the semiconductor device 10B, by using a laminated wiring structure, where the wiring 85c and the wiring 84 in which currents flow in opposing directions are disposed in parallel in the vertical direction so as to overlap each other and cause the respective electromagnetic fields to cancel each other out, as the control terminal 80, it is possible to reduce the inductance of the control terminal 80.

Note that an example has been described here where out of the control terminal 80 that has a laminated wiring structure, the wiring 85b, the through hole 85e, the wiring 85c, the through hole 85d, and the wiring 85a are used to apply a voltage to the gate electrodes 23 of the semiconductor elements 20 and for the inflow and outflow of current and the wiring 84 is used to apply a voltage to the emitter electrodes 22 of the semiconductor elements 20 and for the inflow and outflow of current. Alternatively, out of the control terminal 80, it is also possible to use the wiring 84 to apply a voltage to the gate electrodes 23 of the semiconductor elements 20 and for the inflow and outflow of current and to use the wiring 85b, the through hole 85e, the wiring 85c, the through hole 85d, and the wiring 85a to apply a voltage to the emitter electrodes 22 of the semiconductor elements 20 and for the inflow and outflow of current.

The control terminal 80 that has a laminated wiring structure may be provided on the main surface 31a of the insulating board 31 of the substrate 30 in the same way as the example in the fourth embodiment described above (see FIG. 16A).

It is also possible to connect a plurality of semiconductor devices 10B according to the fifth embodiment in series or in parallel in the same way as the examples in the second embodiment described above (see FIGS. 11 to 13).

Sixth Embodiment

Figure 20A:
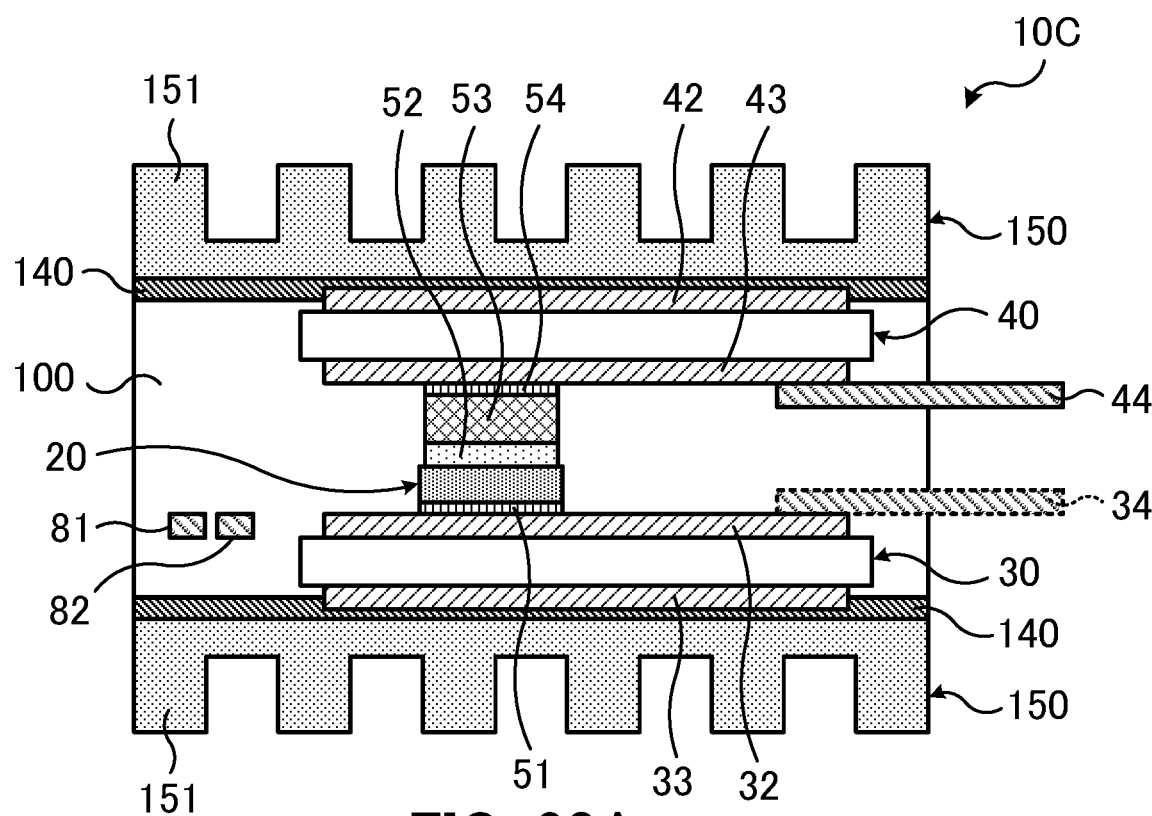
FIGS. 20A and 20B depict one example of a semiconductor device according to a sixth embodiment.
Figure 20B:
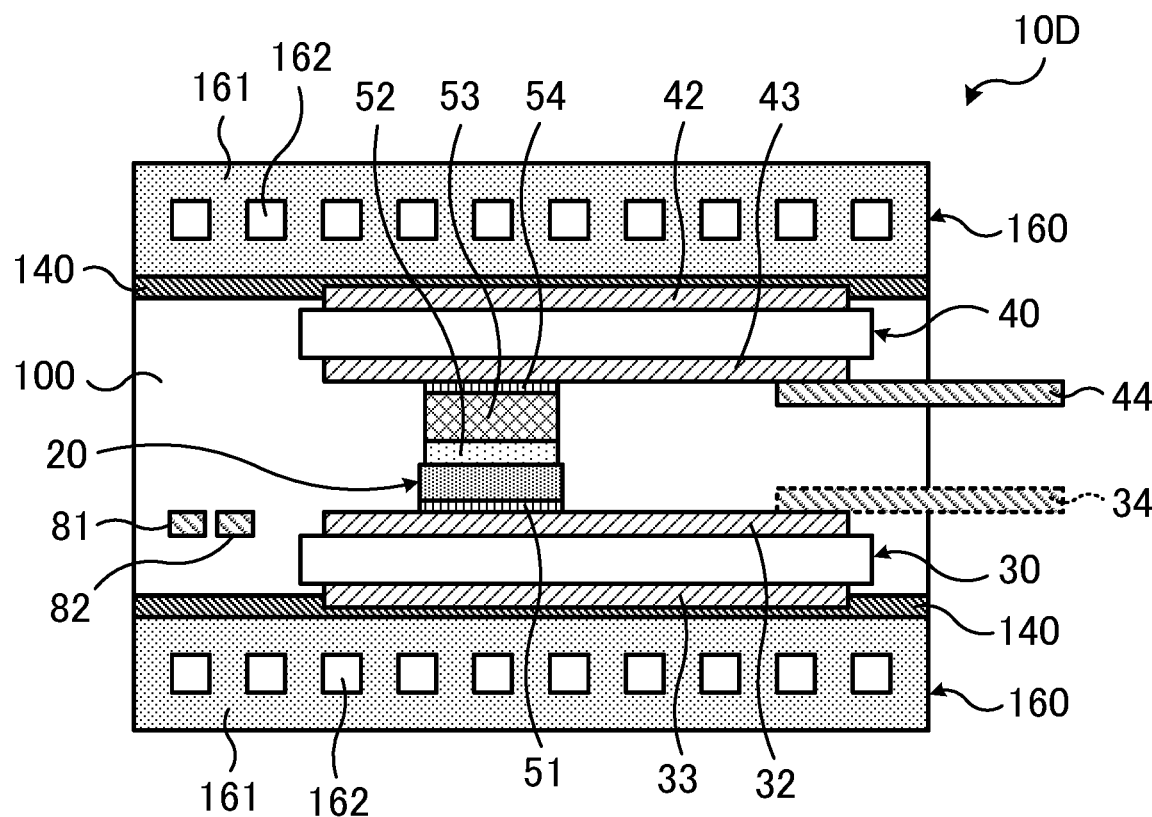

FIGS. 20A and 20B depict one example of a semiconductor device according to a sixth embodiment. FIGS. 20A and 20B are both cross-sectional views schematically depicting a principal part of one example of a semiconductor device.

A semiconductor device 10C depicted in FIG. 20A is configured with a cooling member 150 equipped with a plurality of fins 151 provided via a thermal interface material 140, such as thermal grease, a sintered material such as copper or silver, or a bonding material such as solder, on the resin 100 and the conductor layer 33 of the substrate 30 and the conductor layer 42 of the substrate 40 that are exposed from the resin 100 of the semiconductor device 10 (see FIG. 6 or the like) described in the second embodiment.

In the semiconductor device 10C, the heat generated as the semiconductor elements 20 operate is transmitted to the substrate 30 via the bonding material 51 and is also transmitted to the substrate 40 via the bonding material 52, the metal blocks 53, and the bonding material 54. The heat transmitted to the substrates 30 and 40 is transmitted via the thermal interface material 140 to the cooling members 150 where heat exchanging with the outside air is performed.

In this way, with the semiconductor device 10C, heat is dissipated from the semiconductor elements 20 to both main surface sides. With the semiconductor device 10C, the conductor layer 33 of the substrate 30 and the conductor layer 42 of the substrate 40 are exposed from the resin 100, and the cooling members 150 are thermally connected via the thermal interface material 140 to the conductor layer 33 and the conductor layer 42 that are exposed from the resin 100. With this configuration, heat is efficiently dissipated from the semiconductor elements 20 to the cooling members 150 on both main surface sides, so that the semiconductor elements 20 are efficiently cooled. Since the semiconductor elements 20 are efficiently cooled, it is possible to suppress overheating of the semiconductor elements 20, to suppress damage due to overheating, and to use larger currents.

Note that in the semiconductor device 10C, the cooling members 150 may be provided so as to contact the conductor layer 33 and the conductor layer 42 without the thermal interface material 140 being provided in between.

A semiconductor device 10D depicted in FIG. 20B is configured with cooling members 160 provided via the thermal interface material 140 on the resin 100 and the conductor layer 33 of the substrate 30 and the conductor layer 42 of the substrate 40 that are exposed from the resin 100 of the semiconductor device 10 described in the second embodiment (see FIG. 6 and the like). The cooling members 160 of the semiconductor device 10D each include a main body portion 161 and coolant channels 162, which are provided inside the main body portion 161 and through which a liquid or gaseous coolant flows.

In the semiconductor device 10D, the heat generated as the semiconductor elements 20 operate is transmitted to the substrate 30 via the bonding material 51, and is also transmitted to the substrate 40 via the bonding material 52, the metal blocks 53, and the bonding material 54. The heat transmitted to the substrates 30 and 40 is transmitted via the thermal interface material 140 to the cooling members 160 where heat exchanging is performed with the coolant flowing through the coolant channels 162.

In the semiconductor device 10D, like the semiconductor device 10C described above, heat is efficiently dissipated from the semiconductor elements 20 to the cooling members 160 on both main surface sides, so that the semiconductor elements 20 are efficiently cooled. Since the semiconductor elements 20 are efficiently cooled, it is possible to suppress overheating of the semiconductor elements 20, to suppress damage due to overheating, and to use larger currents.

Note that in the semiconductor device 10D, the cooling members 160 may be provided so as to contact the conductor layer 33 and the conductor layer 42 without the thermal interface material 140 being provided in between.

Here, examples where the cooling members 150 or the cooling members 160 are provided on the semiconductor device 10 according to the second embodiment have been described. It is also possible to provide the cooling members 150 or the cooling members 160 in the same way on the semiconductor device 10A described in the third embodiment (see FIG. 15), the semiconductor device described in the fourth embodiment (see FIGS. 16A and 16B), and the semiconductor device 10B described in the fifth embodiment (see FIG. 17 and the like). Aside from the cooling members 150 and the cooling members 160 described above, it is also possible to provide various cooling members, such as cooling members that use evaporation and condensation of an internally sealed working fluid, on the semiconductor device 10 and the like.

It is also possible to connect a plurality of the semiconductor devices 10C or the semiconductor devices 10D according to the sixth embodiment in series or in parallel in the same way as the examples in the second embodiment described above (see FIGS. 11 to 13).

Seventh Embodiment

Figure 21A:
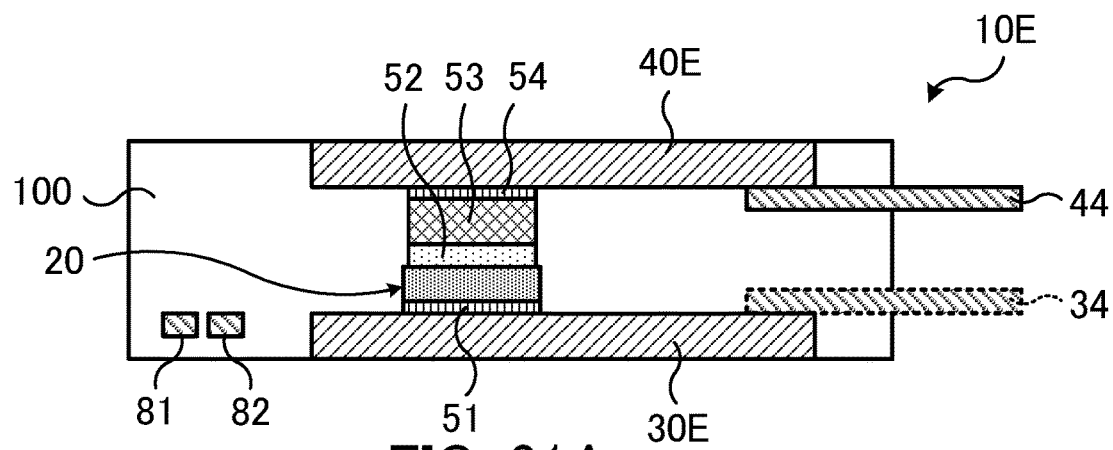
FIGS. 21A to 21C depict one example of a semiconductor device according to a seventh embodiment.
Figure 21B:
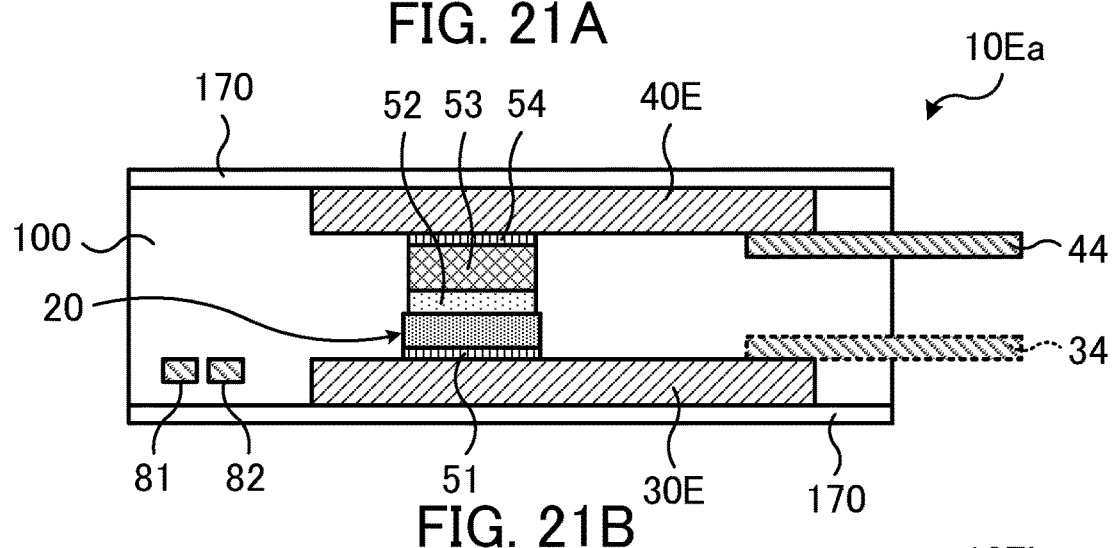
Figure 21C:
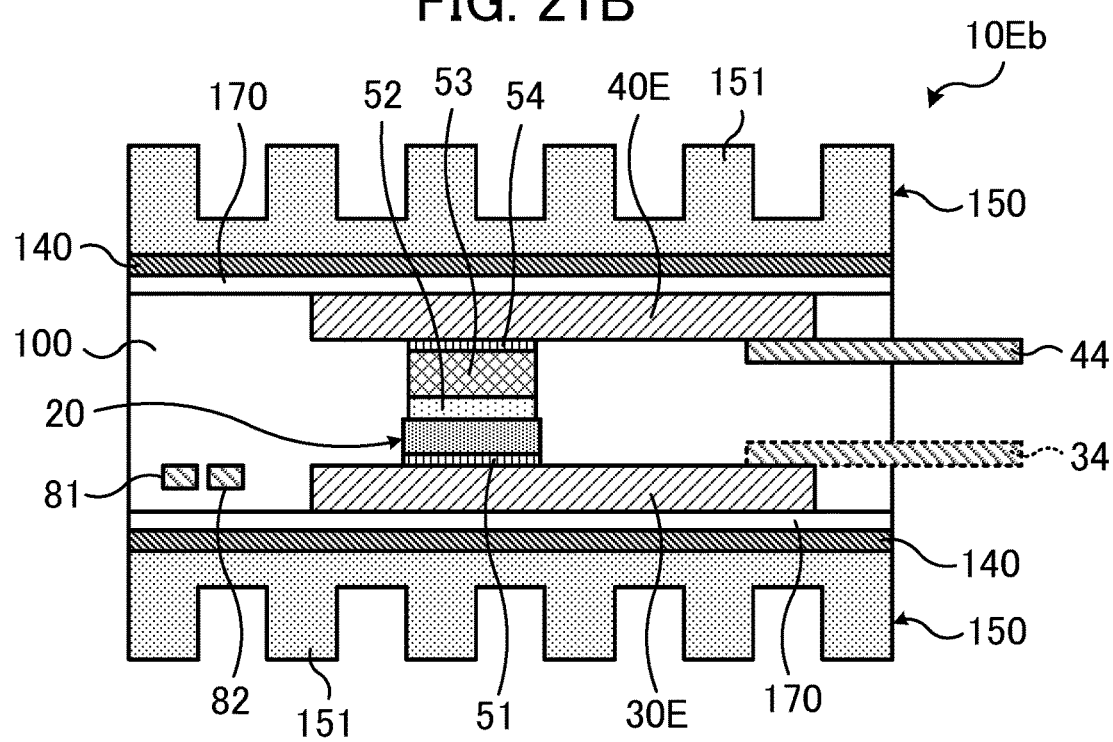

FIGS. 21A to 21C depict one example of a semiconductor device according to a seventh embodiment. FIGS. 21A and 21C are cross-sectional views schematically depicting a principal part of one example of a semiconductor device.

The semiconductor device 10E depicted in FIG. 21A has a configuration where semiconductor elements 20 (as one example here, one semiconductor element 20 as seen in the cross-sectional views) is provided between a conductor plate 30E and a conductor plate 40E that face each other. The conductor plate 30E and the conductor plate 40E are examples of conductor layers. The positive electrode terminal 34 is provided on one conductor plate 30E, and the negative electrode terminal 44 is provided on the other conductor plate 40E. The collector electrode 21 of the semiconductor element 20 is connected to the main surface on the semiconductor element 20 side of the conductor plate 30E via the bonding material 51, and the emitter electrode 22 of the semiconductor element 20 is connected to the main surface on the semiconductor element 20 side of the conductor plate 40E via the bonding material 52, the metal block 53, and the bonding material 54. The gate electrode 23 and the emitter electrode 22 of the semiconductor element 20 are connected to the control terminal 81 and the control terminal 82 via the wires 71 and 72, the lands 61 and 62, and the wires 61a and 62a.

The conductor plate 30E, the conductor plate 40E, and the semiconductor element 20 and the like are sealed with the resin 100 so that end portions of the positive electrode terminal 34 and the negative electrode terminal 44, end portions (81a and 82a) (not illustrated) of the control terminal 81 and the control terminal 82, and main surfaces of the conductor plate 30E and the conductor plate 40E on the opposite side to the semiconductor element 20 side are exposed.

As one example, the semiconductor device 10E uses a lead frame including the conductor plate 30E and the land 61 and the land 62 and may be obtained by mounting the semiconductor element 20, connecting the wire 71 and the wire 72, connecting the control terminals 81 and the control terminal 82 using the wire 61a and the wire 62a, bonding to the conductor plate 40E, and sealing with the resin 100. Alternatively, the semiconductor device 10E may be obtained by providing the conductor plate 30E and the land 61 and the land 62 on a support, mounting the semiconductor element 20, connecting the wire 71 and the wire 72, connecting the control terminal 81 and the control terminal 82 with the wire 61a and the wire 62a, bonding to the conductor plate 40E, sealing with the resin 100, and then removing the support.

The semiconductor device 10E is configured to use the conductor plate 30E and the conductor plate 40E in place of the substrate 30 and the substrate 40 of the semiconductor device 10 according to the second embodiment described above. This semiconductor device 10E is also capable of achieving the same effects as the semiconductor device 10 according to the second embodiment.

Insulating layers (or insulating boards) 170 may be provided on the resin 100 of the semiconductor device 10E depicted in FIG. 21A and also the conductor plate 30E and the conductor plate 40E exposed from the resin 100 as in the semiconductor device 10Ea depicted in FIG. 21B. As one example, as the insulating layers 170, comparatively dense ceramic layers are formed using aerosol deposition. By using this method, it is possible to form insulating layers 170 that are thin and have high insulating performance, and thereby realize a slim semiconductor device 10Ea whose surfaces are protected by the insulating layers 170.

Like the semiconductor device 10Eb depicted in FIG. 21C, cooling members 150 equipped with a plurality of fins 151 may also be provided via a thermal interface material 140 on the insulating layers 170 of the semiconductor device 10Ea depicted in FIG. 21B in the same way as the example of the sixth embodiment (see FIG. 20A). By using this configuration, heat is efficiently dissipated from the semiconductor element 20 to the conductor plate 30E and the conductor plate 40E on both main surface sides and also to the cooling members 150, so that the semiconductor element 20 is efficiently cooled. By doing so, overheating of the semiconductor element 20 is suppressed, damage to the semiconductor element 20 due to overheating is suppressed, and it is also possible to use a larger current. Cooling members 160 that have coolant channels 162 inside a main body portion 161 may be provided via the thermal interface material 140 on the insulating layers 170 of the semiconductor device 10Ea as in the example in the sixth embodiment (see FIG. 20B). It is also possible to provide various cooling members, such as a cooling member that uses evaporation and condensation of an internally sealed working fluid, on the insulating layers 170.

Note that in the semiconductor device 10E, the semiconductor device 10Ea, and the semiconductor device 10Eb, it is possible to integrate the positive electrode terminal 34 with the conductor plate 30E (that is, to form the positive electrode terminal 34 as a part of the conductor plate 30E) and to integrate the negative electrode terminal 44 with the conductor plate 40E (that is, to form the negative electrode terminal 44 as a part of the conductor plate 40E) like the example described in the third embodiment.

In place of the control terminal 81 and the control terminal 82, it is also possible to use a control terminal 80 with a laminated wiring structure (see FIGS. 17 and 18A to 18C) like that described in the fifth embodiment.

It is also possible to connect a plurality of the semiconductor devices 10E, 10Ea, or 10Eb as described in the seventh embodiment in series or in parallel in the same way as in the example in the second embodiment described above (see FIGS. 11 to 13).

According to the present embodiments, it is possible to realize a compact semiconductor device in which semiconductor elements have superior operation performance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device, comprising:
a semiconductor module that includes:
  a first conductor layer;
  a second conductor layer that faces the first conductor layer;
  a first semiconductor element that is provided between the first conductor layer and the second conductor layer, and that has
    a first control electrode,
    a first positive electrode electrically connected to the first conductor layer, and
    a first negative electrode electrically connected to the second conductor layer;
  a positive electrode terminal provided on an edge portion of the first conductor layer at a first side of the semiconductor module in a top view of the semiconductor module;
  a negative electrode terminal provided on an edge portion of the second conductor layer at the first side of the semiconductor module in the top view thereof;
  control wiring that is electrically connected to the first control electrode, and that extends out of the first conductor layer and the second conductor layer at a second side of the semiconductor module that is opposite to the first side in the top view; and a control terminal that is electrically connected to the control wiring, that is positioned outside the first conductor layer and the second conductor layer in the top view, and that has an end portion that is aligned with the positive electrode terminal and the negative electrode terminal.

2. The semiconductor device according to claim 1, wherein the control wiring includes:
a land that is electrically connected to the first control electrode and is separated from the first conductor layer and the second conductor layer; and
a wire that electrically connects the land and the control terminal.

3. The semiconductor device according to claim 2, wherein
the semiconductor module further includes a second semiconductor element that is provided between the first conductor layer and the second conductor layer, and that has
a second control electrode,
a second positive electrode electrically connected to the first conductor layer, and
a second negative electrode electrically connected to the second conductor layer, and
the land is provided between the first semiconductor element and the second semiconductor element in the top view, and is electrically connected to the first control electrode and the second control electrode.

4. The semiconductor device according to claim 2, wherein
the semiconductor module further includes a first insulating board having a main surface on which the first conductor layer is provided, and
the land is provided on the main surface of the first insulating board.

5. The semiconductor device according to claim 1, wherein
the first control electrode has a gate electrode and a sensing electrode,
the control wiring has
gate wiring that is electrically connected to the gate electrode, and
sensing wiring that is electrically connected to the sensing electrode, and
the control terminal has
a gate terminal line that is electrically connected to the gate wiring, and
a sensing terminal line that is electrically connected to the sensing wiring.

6. The semiconductor device according to claim 5, wherein
the control terminal is configured so that part of the gate terminal line and part of the sensing terminal line overlap each other in the top view, and
the control terminal includes an insulating layer interposed between the part of the gate terminal line and the part of the sensing terminal line that overlap.

7. The semiconductor device according to claim 5, wherein
in the semiconductor module, the first negative electrode is integrated with the sensing electrode.

8. The semiconductor device according to claim 1, wherein
the semiconductor module further includes a first insulating board having a main surface on which the first conductor layer is provided, and
the control terminal is provided on the main surface of the first insulating board.

9. The semiconductor device according to claim 1, wherein the end portion of the control terminal, the positive electrode terminal, and the negative electrode terminal are disposed in a staggered arrangement in a side view of the semiconductor module in the first side thereof.

10. The semiconductor device according to claim 1, comprising a plurality of the semiconductor modules that are connected in parallel or in series.

* * * * *